(12) United States Patent
Isshiki et al.

(10) Patent No.: US 6,687,013 B2
(45) Date of Patent: Feb. 3, 2004

(54) LASER INTERFEROMETER DISPLACEMENT MEASURING SYSTEM, EXPOSURE APPARATUS, AND ELECTRON BEAM LITHOGRAPHY APPARATUS

(75) Inventors: Fumio Isshiki, Kokubunji (JP); Masakazu Sugaya, Kawasaki (JP); Tatsundo Suzuki, Musashimurayama (JP); Masahiro Yamaoka, Hachioji (JP); Sumio Hosaka, Hinode (JP)

(73) Assignee: Hitachi, Ltd., Tokyo (JP)

( * ) Notice: Subject to any disclaimer, the term of this patent is extended or adjusted under 35 U.S.C. 154(b) by 90 days.

(21) Appl. No.: 09/818,713

(22) Filed: Mar. 28, 2001

(65) Prior Publication Data

US 2002/0048026 A1 Apr. 25, 2002

(30) Foreign Application Priority Data

Mar. 28, 2000 (JP) ........................................ 2000-089556

(51) Int. Cl.⁷ .............................................. G01B 11/02
(52) U.S. Cl. ........................................ 356/498; 356/496
(58) Field of Search ................................ 356/496, 498, 356/500, 493, 486, 487

(56) References Cited

U.S. PATENT DOCUMENTS 5,184,313 A * 2/1993 Kuwabara et al. .......... 356/498
6,008,902 A   12/1999 Rinn
6,351,312 B1 * 2/2002 Sakuma et al. ............. 356/498

FOREIGN PATENT DOCUMENTS

JP    7306034    11/1995
JP    9178567    7/1997
JP    20014321   1/2001

* cited by examiner

Primary Examiner—Kevin Pyo
(74) Attorney, Agent, or Firm—Antonelli, Terry, Stout & Kraus, LLP

(57) ABSTRACT

An absolute accuracy in the range from ±2 nm to ±1 nm for a displacement measurement value is provided by a laser interferometer displacement measuring system. A fluctuating error component that appears corresponding to the wave cycle of laser light is detected and subtracted from the measurement value while a stage is moving, thereby providing a high accuracy.

10 Claims, 19 Drawing Sheets

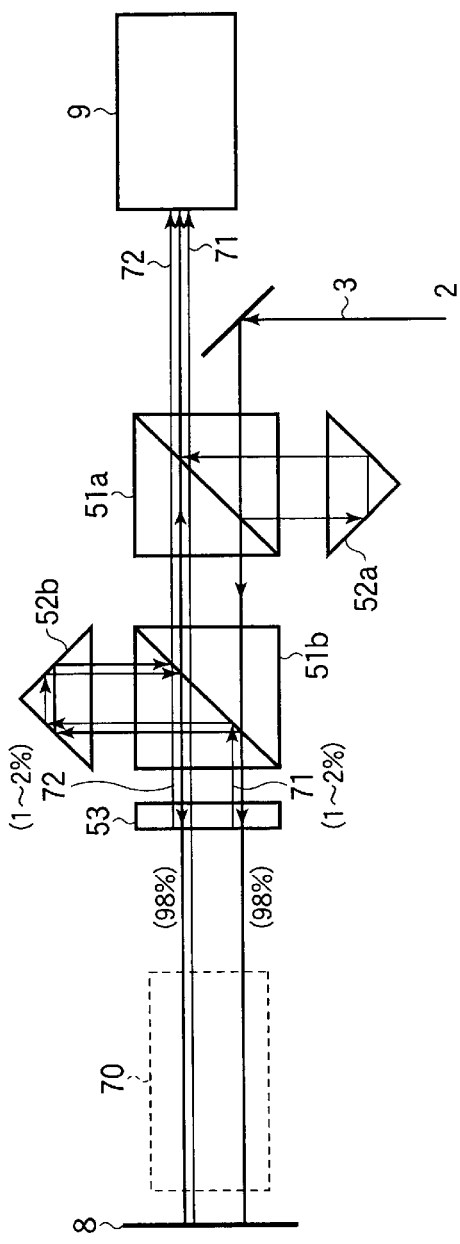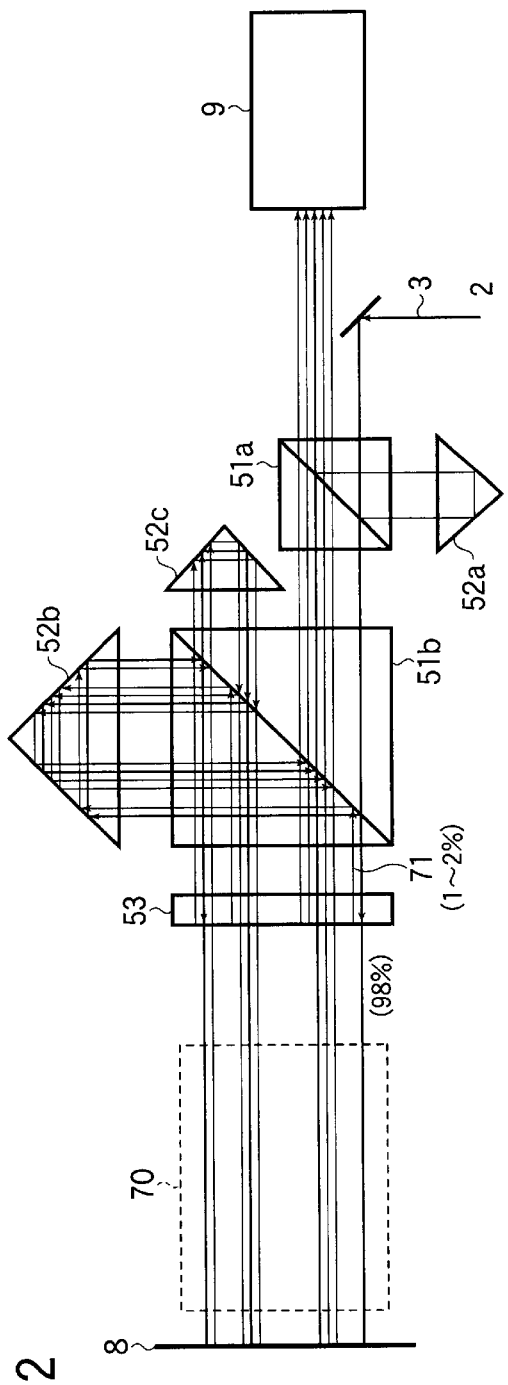
FIG.21
FIG.22

LASER INTERFEROMETER DISPLACEMENT MEASURING SYSTEM, EXPOSURE APPARATUS, AND ELECTRON BEAM LITHOGRAPHY APPARATUS

BACKGROUND OF THE INVENTION

1. Field of the Invention

The present invention relates to displacement measurement techniques, instrumentation techniques, evaluation techniques, precision patterning techniques, fine patterning techniques, semiconductor patterning techniques, and master mask patterning techniques. More particularly, the present invention relates to a displacement measurement technique which requires accuracy of the order of nanometer.

2. Description of the Related Art

For example, a laser interferometer displacement measuring system is often used as high accuracy displacement measurement means for controlling such as a stepper, employed in the photolithography process for fabricating semiconductor devices, and for controlling X-Y stages for use such as in precision machining equipment. A nominal value of resolution is 0.3 nm for the displacement measurement system which provides the most accurate displacement measurement and has been developed particularly for stepping control.

Concerning the provision of increased accuracy, even a general displacement measurement technique that does not employ the laser interferometer displacement measuring technique but employs noise processing by averaging is disclosed in Japanese Patent Laid-Open Publication No. Hei 7-306034 in relation to the non-contact displacement measurement. Optical measurement employing an optical interferometer is disclosed in Japanese Patent Laid-Open Publication No. Hei 9-178567 in relation not to position but to wavelength measurement.

However, in many cases, even the current laser interferometer displacement measuring system having a nominal value of resolution of 0.3 nm actually provides only an absolute accuracy of the order of ±2 nm for displacement measurement. The resolution and the absolute accuracy are essentially different from each other. An interferometer displacement measuring system may apparently have an accuracy of 0.3 nm in the range of about 10 nm, but in some cases, a gradual undulation may be generally found with the magnitude reaching 3 nm or more in the range of 100 to 300 nm. These problems were not made clear until a high-speed real-time displacement measurement approach was developed to thereby make it possible to measure the displacement of a moving object with high accuracy at a frequency greater than that of mechanical vibrations.

In general, to provide an increased accuracy, the noise processing by averaging over time is performed as mentioned above in order to improve the accuracy (i.e., relative accuracy) of stability of measurement values under a standstill condition of the object. However, with a recent increasing demand for increased accuracy, the absolute accuracy of measurement values has become necessary. In the course of study to the present invention, such a problem has become clear that the prior-art noise processing by averaging cannot provide a sufficient absolute accuracy.

In view of the aforementioned problems, it is therefore the object of the present invention to provide a high-accuracy interferometer displacement measuring system which provides an absolute accuracy in the range of ±2 nm to ±1 nm or less for a displacement measurement value using interference of laser light.

SUMMARY OF THE INVENTION

In consideration of the fact that the interference of light itself, which is the principle of laser interferometry, causes an error, the present invention is adapted to eliminate errors, concerning absolute accuracy, which cannot be eliminated only by averaging over time. Approaches to increased accuracy that focus attention on such a cause of error have never discussed before. More specifically, a correction value corresponding to the laser wave cycle of a displacement is added to a displacement output of the laser interferometer displacement measuring system, thereby correcting the distortion error in the interferometer displacement measuring system.

Upon measurement of a continuously moving object as a measurement target, the laser interferometer displacement measuring system according to the present invention stores and corrects, as a measurement error caused by the interference effect, an oscillatory component that appears in the cycle consistent with the frequency of laser light, thereby implementing an increased accuracy. Even such a correction method for allowing a relatively simple sinusoidal wave to be added to or subtracted from a measurement value can reduce the range of error of absolute position about ±2 nm to within ±1 nm, thereby making it possible to provide an increased accuracy.

That is, a laser interferometer displacement measuring system according to the present invention is characterized by comprising a displacement measurement mechanism making use of laser interference, and corrector means for adding a correction value to or subtracting the correction value from a measurement value of the displacement measurement mechanism. The corrector means uses a cyclic correction value having a cycle corresponding to a wave cycle of laser light.

Furthermore, a laser interferometer displacement measuring system according to the present invention is characterized by comprising a displacement measuring mechanism making use of laser interference, and corrector means for adding a correction value to or subtracting the correction value from a measurement value of the displacement measurement mechanism. The corrector means has storage means for storing a cyclic correction value having a cycle corresponding to a wave cycle of laser light, and the correction value is read out of the storage means in accordance with the measurement value and is added to or subtracted from the measurement value. It is possible to employ a rewritable memory as the storage means.

Furthermore, a laser interferometer displacement measuring system according to the present invention comprises a laser light source, an interferometer for dividing laser light of wavelength λ emitted from the laser light source into a reference path beam and a measurement path beam to interfere the reference path beam with the measurement path beam having been reflected from a subject body, a light detector for detecting the light subjected to the interference in the interferometer, and measurement value output means for converting a detection signal of the light detector into a measurement value to output the resulting value. In the system, a displacement of the subject body causes an n-fold variation in length of an optical path between the interferometer and the subject body. The laser interferometer displacement measuring system is characterized by further comprising corrector means for adding a correction value to or subtracting the correction value from the measurement value of the measurement value output means. The system is also characterized in that, with the measurement value being employed as a variable, the corrector means uses, as the correction value, a cyclic function having a cycle of $\lambda/n$ or a sum of a plurality of cyclic functions having the cycle of $\lambda/n$ as a fundamental cycle. The plurality of cyclic functions having the cycle of $\lambda/n$ as a fundamental cycle can be the cyclic function having a cycle of $\lambda/n$ and harmonic cyclic functions thereof.

The aforementioned laser interferometer displacement measuring system according to the present invention can comprise means for performing feedback control so as to carry out tracking adjustment of a phase and amplitude of the correction value.

A laser interferometer displacement measuring system according to the present invention is characterized by comprising a displacement measurement mechanism making use of laser interference, and corrector means for adding a correction value to or subtracting the correction value from a measurement value of the displacement measurement mechanism. The corrector means prepares a plurality of types of cyclic functions having a cycle corresponding to a wave cycle of laser light, and assigns weights to each of the cyclic functions to allow the resulting cyclic functions to be added to or subtracted from the measurement value.

It is also possible to employ mathematically orthogonal cyclic functions as the plurality of types of correction value cyclic functions. For example, as the mathematically orthogonal cyclic function, it is possible to use the sinusoidal (sin) and cosine (cos) functions and a group of harmonics of these cyclic functions. In addition, as the plurality of types of correction value cyclic functions, it is possible to use a triangular wave function and a group of orthogonal harmonic cyclic functions of the triangular wave. Incidentally, the plurality of types of correction value cyclic functions do not have necessarily to be mathematically orthogonal cyclic functions.

To use functions that are orthogonal to each other as the plurality of types of cyclic functions, the system can be provided with calculation means for calculating the magnitude of the component of each cyclic function in the cyclic error contained in a measurement value by integrating each cyclic function individually with the measurement value to perform the weighting by means of the output of the calculation means.

Furthermore, the system can be provided with phase shift means for shifting the phase of the plurality of types of cyclic functions at the same time to perform feedback control on the amount of shift provided by the phase shift means.

It is preferable to make the feedback time constant of the amount of shift provided by the phase shift means shorter than the feedback time constant of other amplitudes. It is preferable to provide the system with means for enabling the feedback control only when the subject body is moving at a given speed or greater.

Furthermore, it is possible to dispose averaging means capable of averaging over time after the aforementioned corrector means. It is also possible to configure the system to bypass the averaging processing provided by the averaging unit means for output.

Furthermore, a laser interferometer displacement measuring system according to the present invention is characterized by comprising a displacement measurement mechanism making use of laser interference, and error signal component generating means for eliminating a constant speed component and an acceleration component from a measurement value of the displacement measurement mechanism and generating an error signal component. The system further comprises storage means for storing the error signal component generated from the error signal component generating means corresponding to the measurement value, and means for allowing the error signal component stored in the storage means to be added to or subtracted from the measurement value of the displacement measurement mechanism as a correction value.

Furthermore, a laser interferometer displacement measuring system according to the present invention comprises a laser light source, an interferometer for dividing laser light of wavelength $\lambda$ emitted from the laser light source into a reference path beam and a measurement path beam to interfere the reference path beam with the measurement path beam having been reflected from a subject body, a light detector for detecting the light subjected to the interference in the interferometer, and measurement value output means for converting a detection signal of the light detector into a measurement value to output the resulting value. In the system, a displacement of the subject body causes an n-fold variation in length of an optical path between the interferometer and the subject body. The laser interferometer displacement measuring system is characterized by further comprising corrector means for adding a correction value to or subtracting the correction value from the measurement value of the measurement value output means. The corrector means comprises means for storing or calculating, with the measurement value being employed as a variable, a cyclic function having a cycle of $\lambda/n$ or the cyclic function having a cycle of $\lambda/n$ and harmonic cyclic functions thereof, and error signal component generating means for eliminating a constant speed component and an acceleration component from a measurement value of the displacement measurement mechanism and generating an error signal component. The corrector means further comprises adjustment means for adjusting an amplitude and a phase of the cyclic function so that the cyclic function having a cycle of $\lambda/n$ or a sum function of the cyclic function having a cycle of $\lambda/n$ and harmonic cyclic functions thereof fits to the error signal component, and means for allowing a function value of the cyclic function having a cycle of $\lambda/n$ or a function value of the sum function of the cyclic function having a cycle of $\lambda/n$ and harmonic cyclic functions thereof to be added to or subtracted from the measurement value.

The system can be configured such that correction processing is carried out by means of hardware in a real time manner or implemented by software means in conjunction with a mechanism for calculating correction values.

A laser interferometer displacement measuring system according to the present invention makes it possible to drive a displacement measurement subject at a given speed upon activation or initialization of the system to acquire correction data at that time. In addition, a laser interferometer displacement measuring system according to the present invention may be adapted to be combined with a stage control device to set a correction value of a correction table for use in laser displacement measurement at the time of initial operation or control of the stage.

The measurement value correcting means or means for implementing the method for correcting measurement values can be integrated on a measuring board (counter board or axis board) for laser interferometry.

A laser interferometer displacement measuring system according to the present invention can be mounted on a single-axis stage, a multi-axis stage, or an X-Y stage.

An apparatus according to the present invention comprises a stage for placing thereon and moving a sample or a subject work, drive means for driving the stage, and a laser interferometer displacement measuring system for measuring a position of the stage. The apparatus is characterized in that, as the laser interferometer displacement measuring system, the aforementioned laser interferometer displacement measuring system is employed. Examples of those apparatuses include an electron beam lithography system, a stepper for fabricating semiconductors (an exposure apparatus), a fine patterning system, metal machining equipment, ceramic machining equipment, mask pattern transfer equipment, mask patterning equipment, an electron-beam scanning microscope with a displacement measurement function, a transmission electron microscope with a displacement measurement function, and non-contact shape measurement equipment.

A laser interferometer displacement measuring system according to the present invention comprises a light detector for detecting the light subjected to interference, phase detector means for detecting a phase from a detection signal of the light detector, accumulator means for accumulating variations in phase obtained from the phase detector means, correction value generating means for generating a correction value from an accumulated value provided by the accumulator means or the phase value, and corrector means for allowing the correction value, generated by the correction value generating means, to be added to the accumulated value or the phase value. The correction value generating means generates a cyclic correction value of wavelength $\lambda$ of laser light with the accumulated value or the phase value being employed as a variable and eliminates a signal component produced in phase with the wave cycle of the laser light.

The correction value generating means generates a correction value with an accumulated value, not a phase value, or variations in phase value being employed as a variable, thereby generating a cyclic correction value at a cycle of $\lambda$ independent of n. The correction value is generated in the cycle of $\lambda$, thereby extracting the error of a plurality of cyclic components corresponding to each harmonic component of 1 to 2 n harmonic waves of wavelength $\lambda$.

The laser interferometer displacement measuring system according to the present invention comprises means for suppressing a relative peak intensity, with respect to a baseline of a frequency spectrum, of a peak of frequency component $f=Nv/\lambda$ (N is a natural number of 1 to 2 n and not equal to n) of a signal generated in the light detector due to a movement of the subject body at speed v. This allows for eliminating those frequency components to provide increased accuracy for the laser interferometer displacement measuring system.

BRIEF DESCRIPTION OF THE DRAWINGS

In the accompanying drawings:

FIG. 21 is a view showing a laser interferometer displacement measuring system with a four-fold measurement path (n=4) in which an optical error is occurring in the optical system;

FIG. 22 is a view showing a laser interferometer displacement measuring system with an eight-fold path (n=8) in which an optical error is occurring in the optical system;

DETAILED DESCRIPTION OF THE PREFERRED EMBODIMENT

Now, the present invention will be explained below with reference to the accompanying drawings in accordance with the embodiments.

Figure 2:
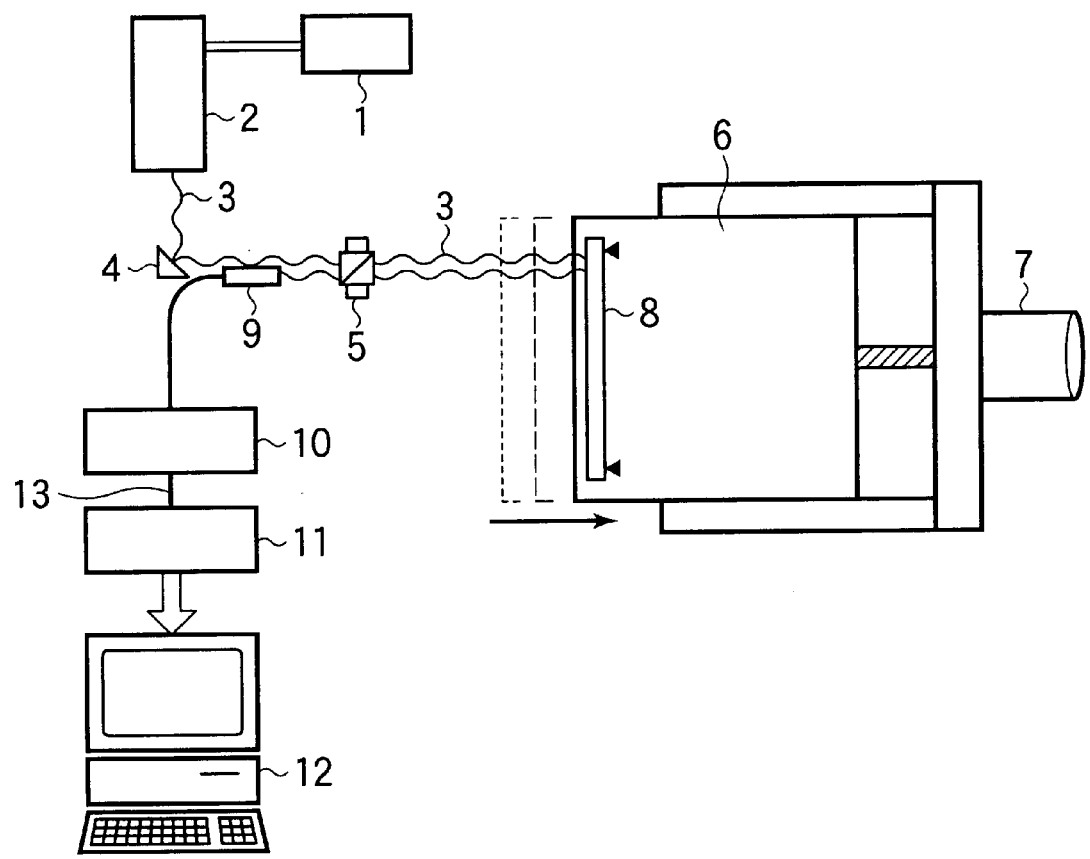
FIG. 2 is a view showing the overall configuration of a high accuracy displacement measuring system according to the present invention, including a laser interferometer displacement measuring system and a driving system.

[Embodiment 1]
Basic Configuration of a Laser Interferometer Displacement Measuring System with a Distortion Correction Function The overall exemplary configuration of a laser interferometer displacement measuring system according to the present invention is shown in FIG. 2. In the figure, shown is an actual example in which laser displacement measurement is employed for measuring a single-axis stage with accuracy and performing feedback control. The single-axis stage has a motor or the like as a stage driving power source 7 and detects the distance of a movable stage table 6 using variations in position of a reflector 8 on the stage table.

A laser power supply 1 drives a gas laser light source 2 to generate laser light 3, which is in turn reflected on a beam bender 4 and then introduced into an interferometer 5. The optical path is divided into two paths inside the interferometer 5. One of the optical paths is the measurement path in which the light reaches the reflector 8 on the stage table 6 and is then reflected thereon to return to the interferometer 5. The other optical path is the reference path in which the light is reflected inside the interferometer 5. This example employs a four-fold optical path (in which light travels twice between the interferometer 5 and the reflector 8) for laser displacement measurement. The light beams of the measurement path and the reference path are mixed in the interferometer 5. Mixing the two light beams causes interference to occur. The light having caused the interference is launched from the interferometer 5 and then detected by a light detector 9. The light detector 9 detects the light and converts the detected amount of light into an electrical signal. A measuring board 10 converts the resulting electrical signal into a coordinate value and then outputs the resulting value as a measurement value 13. Means for increasing displacement output value accuracy 11 corrects the measurement value 13 to output a measurement value 23 with increased accuracy. A personal computer 12 for collecting data and performing control captures the value to perform feedback to the position of the stage and a correction mechanism. Incidentally, the measuring board 10 is generally called a counter board or an axis board, but is herein consistently referred to as the measuring board.

The present invention relates particularly to a correction method and means, employed in the means 11 for increasing displacement output value accuracy. In this embodiment, this is hereinafter described as independent processing means as shown in FIG. 2. This is because this function is implemented in the form of electrical signal processing and can be implemented by either hardware or software. Thus, it is made possible to implement this function by incorporating the means 11 as hardware into the measuring board 10 or by incorporating the means 11 as software into the personal computer 12. It is also possible to use independent hardware to implement an independent configuration as shown in FIG. 2.

The gas laser light source 2 employed in this embodiment is a He—Ne gas laser for emitting laser light at a wavelength of 633 nm. A high-frequency electromagnetic wave is applied to the gas for excitation. Incidentally, a vacuum chamber can be employed to seal the interferometer 5 and the subsequent portions (the interferometer 5, the stage table 6, and the reflector 8) therein to provide the measurement path in a vacuum, thereby making it possible to prevent an error in measurement caused by variations in refractivity due to a fluctuation of air or a change in humidity of air. Furthermore, to maintain the accuracy of measurement, a multi-layered coating is applied to the components such as the beam bender 4, the interferometer 5, and a transparent window which are attached to the wall of the vacuum chamber in order to prevent unnecessary multiple reflections.

The laser interferometer displacement measuring system configured as such makes it possible to provide measurement values or coordinate outputs at a resolution of 0.3 nm and a high sampling rate of 10 MHz. A specific signal example is shown in FIG. 3.

Figure 3A:
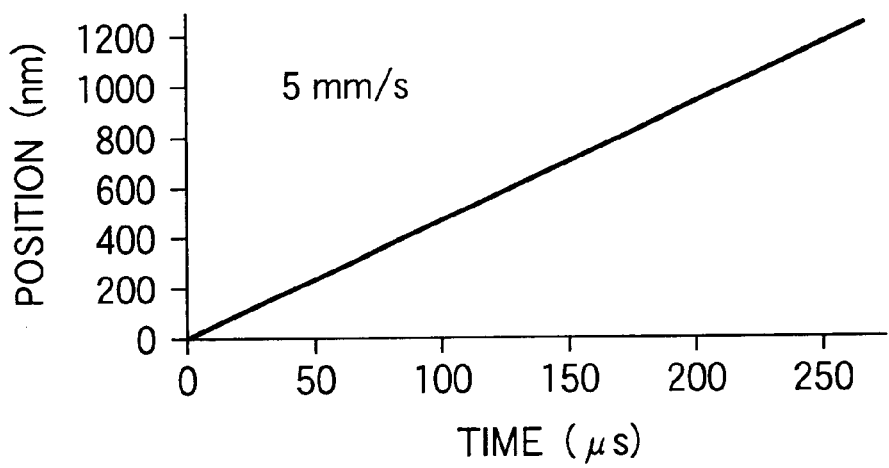
FIG. 3 is a view showing time-dependent variations in measurement value when the displacement of a stage moving at a constant speed (5 mm per second) is measured by a laser interferometer displacement measuring system without any correction.
Figure 3B:
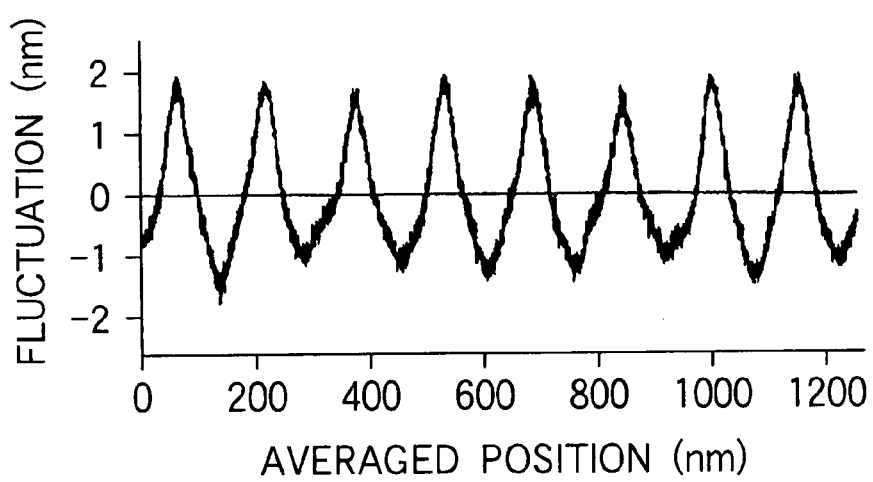

FIG. 3A shows variations in measurement value, measured using the system configuration of FIG. 2 at a resolution of 0.3 nm and a 10 MHz sampling rate while the single-axis stage is moving at a constant speed (5 mm per second). The movement at the constant speed of the single-axis stage causes the measurement values to apparently move linearly with respect to time. However, it would be found that the measurement values, when magnified, are actually not on a straight line. FIG. 3B shows a signal obtained by subtracting a linear component and a slight acceleration component (a parabolic component) from the signal of FIG. 3A with the scale of the vertical axis being enlarged. Incidentally, the original signal is the same as that of FIG. 3A. The horizontal axis has been changed from the time to the position (length) scale, however, the data is taken from the same time-interval. As can be seen from FIG. 3B, the measurement value fluctuates in the range of about ±2 nm and varies cyclically. The fluctuation has four cycles for about 630 nm.

Figure 4A:
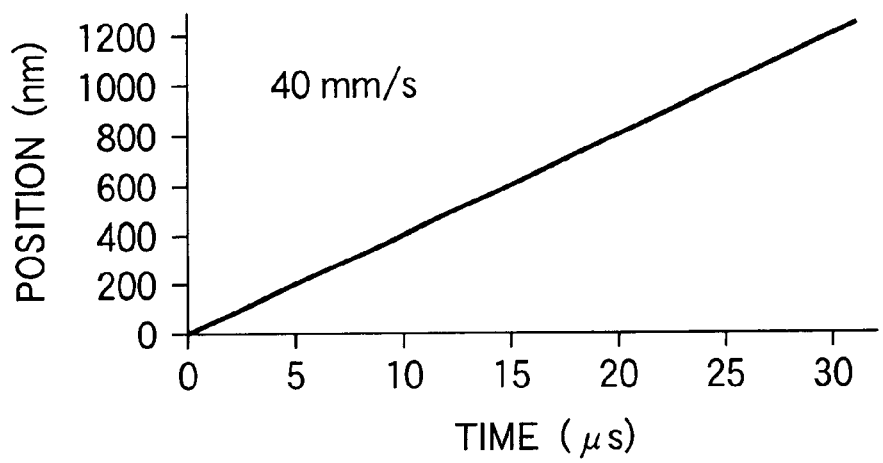
FIG. 4 is a view showing time-dependent variations in measurement value when the displacement of a stage moving at a constant speed (40 mm per second) is measured by a laser interferometer displacement measuring system without any correction.
Figure 4B:
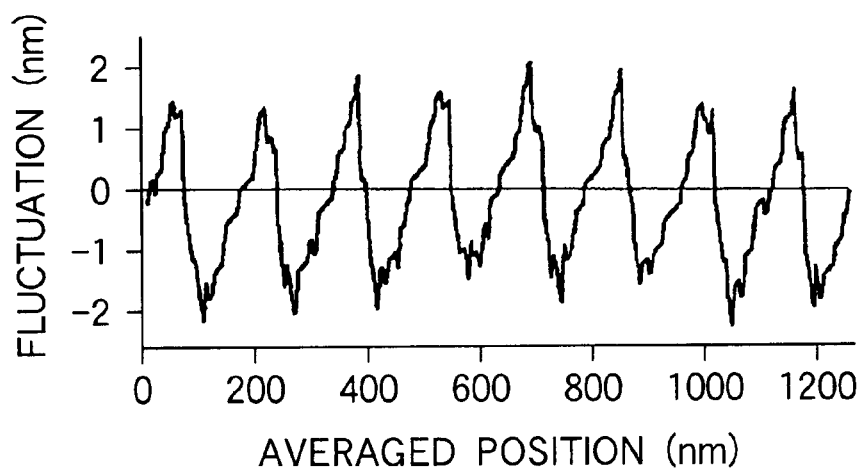

FIG. 4 shows similar data that has been obtained at a different traveling speed of the stage. FIG. 4A shows time-dependent variations in measurement value provided when the single-axis stage moves at a speed of 40 mm per second. FIG. 4B shows a signal obtained by subtracting a linear component and a parabolic component from the signal of FIG. 4A. Other points are the same as those FIGS. 3A and B. As in FIG. 3, the stage looks as if it moves linearly in FIG. 4A. However, in FIG. 4B where the linear and parabolic components have been eliminated from the measurement values, it can be found that the measurement values fluctuate with an amplitude of about ±2 nm in a cyclic manner. The fluctuation has four cycles in the range of about 630 nm, which are generally the same as those of FIG. 3. The wavelength of the He—Ne laser employed as the laser light source has a wavelength of 633 nm and the aforementioned cycles are exactly consistent with that of the alternating light and dark pattern caused by the interference of the laser light. This shows that the cycle is an error in measurement caused by variations in quantity of laser light at a high frequency in the light detector 9.

Due to this error, the measurement of a displacement of 70 nm or greater would provide an absolute accuracy in the range of an error of about ±2 nm. Thus, even with such a laser interferometer displacement measuring system with a nominal value of resolution of 0.3 nm, the value of absolute accuracy would be measured being deteriorated several times in some cases as described above.

To correct this deterioration, the waveforms obtained as shown in FIGS. 3B and 4B may be pre-stored as a correction value to subtract the correction value from subsequently obtained measurement values. This makes it possible to increase accuracy. The cycle of fluctuation corresponds exactly to that of the laser wavelength. Accordingly, based on the value obtained by measurement, a cyclic value may be generated corresponding to the wavelength cycle of laser light and used as a correction value. The correction may be either carried out giving a high priority to a real-time property (the property of real-time processing) by means of hardware or may be implemented by software means in conjunction with a mechanism for calculating correction values (shown in Embodiments 2 to 5).

Figure 5:
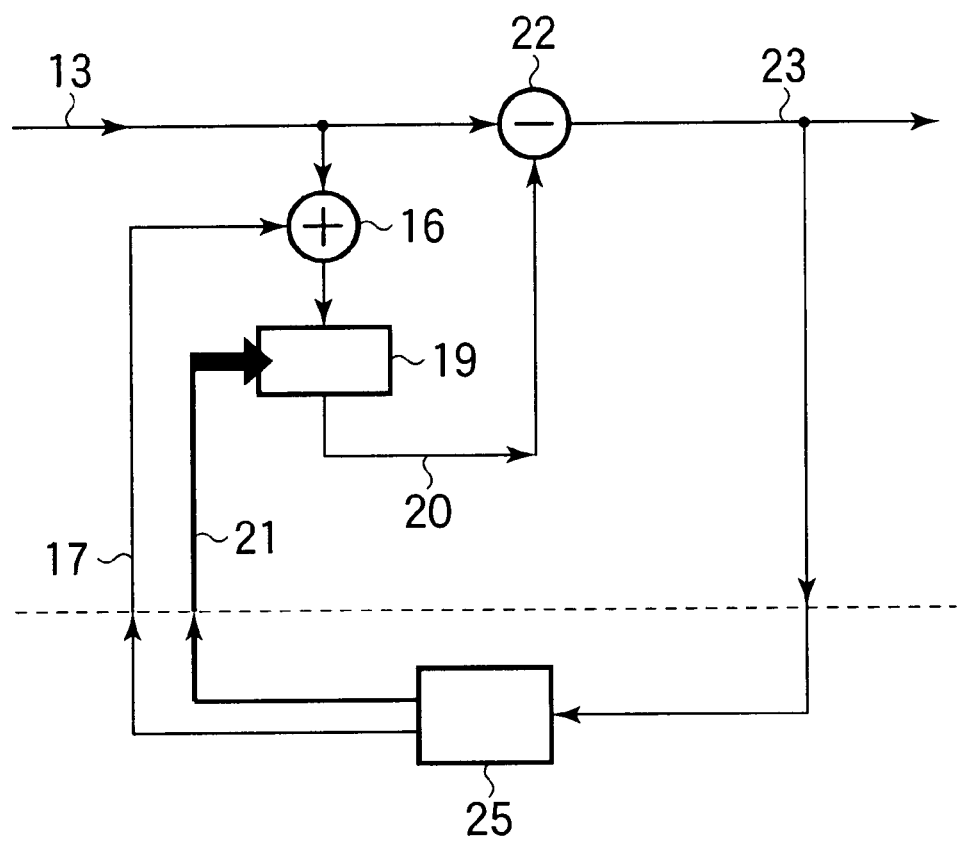
FIG. 5 is a view showing the flow of signals in an exemplary configuration of distortion error corrector means according to the present invention.

A method for processing a signal to implement the correction is shown in FIG. 5. FIG. 5 shows an example of the means 11 for increasing displacement output value accuracy, by which the measurement value 13 outputted from the measuring board 10 is captured to output a measurement value 23 with increased accuracy. In accordance with the captured measurement value 13, a correcting value 20 is read from a memory device 19 and corrected by a adder/subtractor 22, then being outputted as the measurement value 23 with increased accuracy. Designated as 25 is a parabolic component extracting filter unit for outputting a phase shifting value 17.

The correcting value 20 is generated as described below. First, a phase adder 16 adds the phase shifting value 17 to the measurement value 13 and then outputs the resulting value as a table reference address 18. In accordance with the table reference address 18, the memory device 19 outputs the correcting value 20 stored therein. The memory device 19 has data stored therein, which is to be outputted as the correcting value 20 and which provides a cyclic value corresponding to the wavelength cycle of laser light. The value can be set to a given one presetting value 21. It is desirable that the table reference address 18 be cyclic in accordance with the cycle of the laser wavelength. In this regard, only the upper bits equal to or greater than the wavelength cycle can be ignored when the measurement value of laser interferometry employs those outputted digitally with two to the power of N being adopted as the wavelength cycle. More specific values to be stored in the table are the waveforms (or one cycle of the waveform) shown in FIGS. 3B and 4B, which may be stored as they are. Besides this, a sinusoidal (sin) waveform having the same cycle can be employed to allow the correction to provide the same effect of increasing accuracy.

Figure 1:
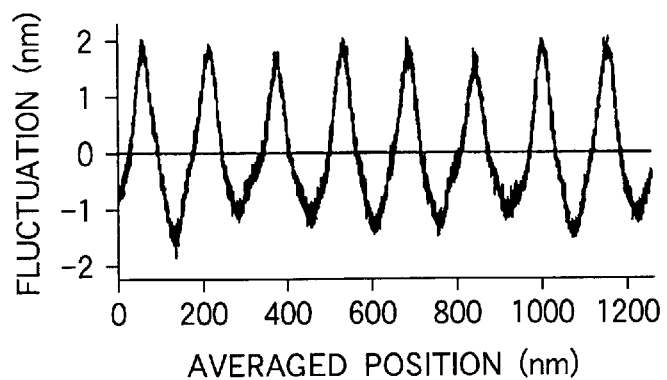
FIG. 1 is a view showing the principle of a correction method according to the present invention.
Figure 1:
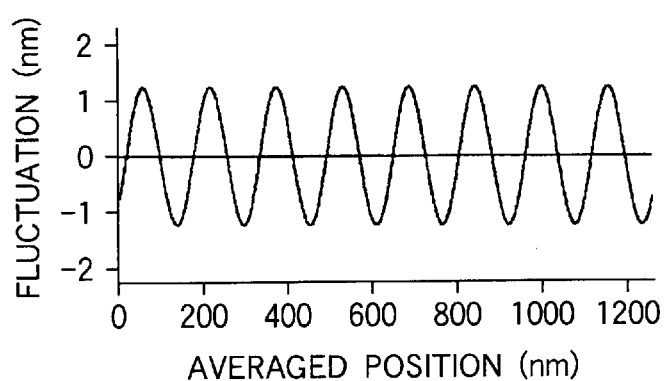
Figure 1:
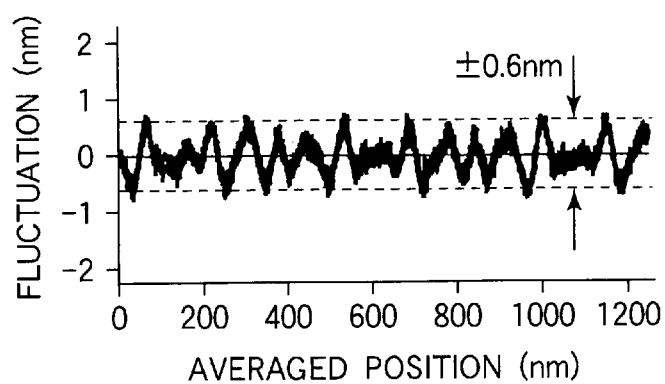

FIG. 1 shows the effect of increasing accuracy according to the present invention. FIG. 1 shows a case where the waveform of fluctuation of FIG. 3B is subtracted by the oscillation component of a single sinusoidal wave as a correction value, thereby providing increased accuracy. In this case where the original waveform has been sufficiently tracked, it is found that accuracy can be increased about three times with respect to the original accuracy to be in the range of about ±0.6 nm. It is possible to further improve this accuracy by optimizing the waveform of the correction value to be employed for the subtraction. This method will be described in Embodiments 3 to 5. In the Embodiments 2 and 3, shown is the configuration of a system for fitting a sinusoidal wave by automatic tracking, the system being provided with an increased accuracy shown in FIG. 1.

Incidentally, in the configuration of this system, the memory device 19 is not inevitably necessary. Values corresponding to the table may be calculated on the spot. In many cases, however, simultaneous use of a memory device may generally facilitate configuration of the system. This provides such flexibility that processing can be performed at high speeds with no operation time being required and any given values can be set without employing any operational equations. The phase adder 16 and the phase shifting value 17 are also not essential but provide increased flexibility and an advantage of not having to rewrite all values of the table in the memory when it is desired to shift only the phase of the correction value.

Incidentally, take the operation of subtracting the linear and acceleration components from FIG. 3A to yield FIG. 3B, and the operation of converting FIG. 4A into FIG. 4B. These operations can be implemented specifically by fitting the quadratic function expressed in the form of equation 1 shown below to the measurement values by the least square method in a statistical manner and then by subtracting the average displacement value of the resulting fitting.

[Equation 1]

$$y(x)=ax^2+bx+c$$

where "x" is the horizontal axis and "y" is the vertical axis.

This fitting can be carried out by determining constants a, b, and c with respect to "yi" and "xi" in accordance with equation 2 employing a determinant in a statistical manner. That is, $$\begin{pmatrix} a \\ b \\ c \end{pmatrix} = \begin{pmatrix} X4 & X3 & X2 \\ X3 & X2 & X1 \\ X2 & X1 & N \end{pmatrix}^{-1} \begin{pmatrix} X2Y \\ XY \\ Y1 \end{pmatrix} \quad \text{[Equation 2]}$$

$$X2Y = \sum_{i=1}^{N} (x_i^2 y_i), \quad XY = \sum_{i=1}^{N} (x_i y_i), \quad Y1 = \sum_{i=1}^{N} y_i,$$

$$X1 = \sum_{i=1}^{N} x_i, \quad X2 = \sum_{i=1}^{N} x_i^2, \quad X3 = \sum_{i=1}^{N} x_i^3,$$

$$X4 = \sum_{i=1}^{N} x_i^4$$

where "yi" is the measurement value either in the range of about four cycles before and after the desired center of correction or in the range of about six cycles before or after the point, and "xi" is the coordinate of each point.

The determined a, b, and c are substituted for the quadratic equation again to determine "y" with respect to the point "x", the error of which is to be determined. A parabolic component extracting filter 25 performs this processing. The operation can be implemented by subtracting the "y" determined as such from "yi".

Summarizing the aforementioned procedure, first, the measurement values 13 that are outputted continuously from the measuring board 10 are fitted by a quadratic function to subtract a fitted average displacement from an actual measurement value, thereby determining the fluctuation error shown in FIGS. 3B and 4B. With this fluctuation error being employed as a correction value, the correction value is subtracted from subsequent measurements, thereby making it possible to provide a measurement value which has a fluctuation error cancelled out and is increased in accuracy.

Figure 6:
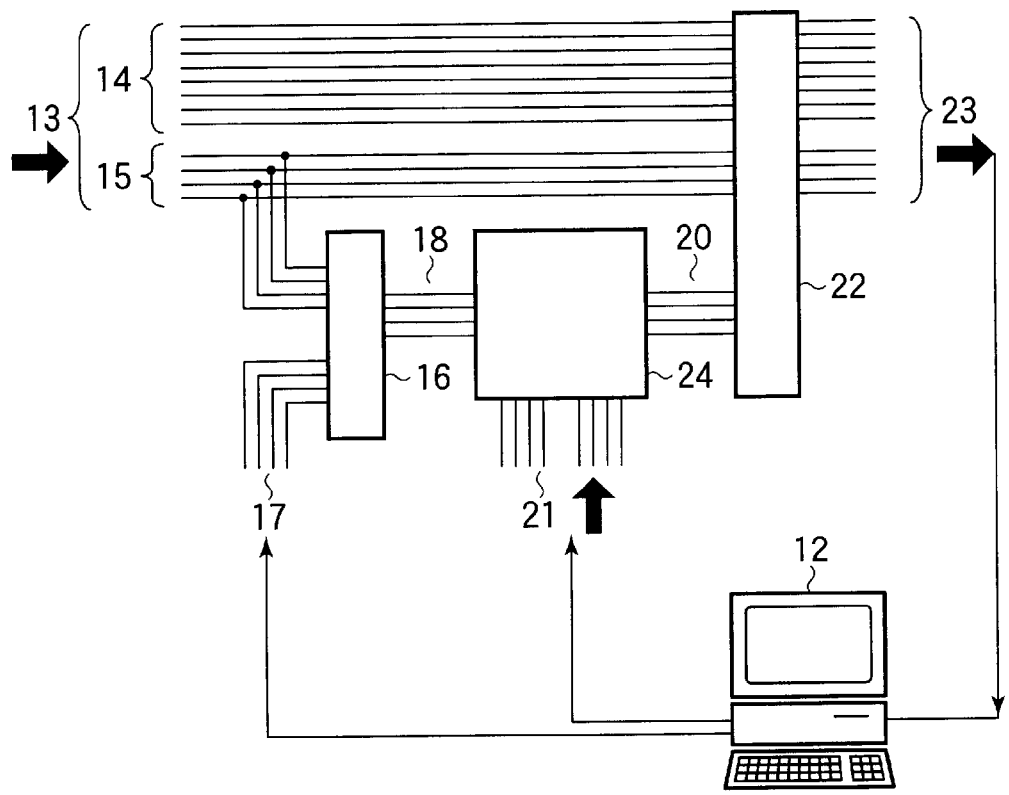
FIG. 6 is a view showing an exemplary configuration of distortion error corrector means according to the present invention, in which the portion required for high speeds is constructed by hardware, showing the circuit configuration of the hardware portion and a feedback path.

FIG. 6 is a view showing an exemplary circuit for specifically implementing this by using a hardware-wise circuit configuration. The measurement value 13 from the laser interferometer displacement measuring system is divided into upper bits 14 corresponding to the wave cycle number of the laser and lower bits 15 indicative of the position of decomposing one wavelength cycle. Among these lower bits, only the signal of the lower bits is extracted and added to the phase shifting value 17 at the phase adder 16. Thereafter, the phase value 18 after shifting is inputted as the address of a dual port RAM (Random Access Memory) 24. Incidentally, the dual port RAM is employed as the memory device here. With the presetting values 21 being pre-stored in the dual port RAM 24, the correcting value 20 is read in accordance with the phase value 18 after shifting. This correction value is added in the adder/subtractor 22 to the original measurement value 13 (the position coordinate signal produced by combining the upper bits 14 corresponding to the wave cycle number with the lower bits 15 indicative of the position of decomposing one wavelength cycle), thereby providing the displacement value 23 after distortion correction. The correction value for addition may be normally sufficiently about 8 bits, and the upper bit portion insufficient for the number of bits (about 32 bits) of the measurement value is extended by 8 bits for addition.

As described above, the measurement value 13 of the laser interferometer displacement measuring system is typically configured to count and output the wavelength cycle number in order to simplify the configuration of the hardware. This makes it possible to divide the measurement value 13 into the bus of the upper bits 14 corresponding to the wave cycle number of the laser and the lower bits 15 indicative of the position of decomposing one wavelength cycle. In the aforementioned embodiment, a cyclic correction is implemented with a simple configuration by making use of this feature.

The correction value to be stored in the dual port RAM 24 is the same as the operation for subtracting the aforementioned parabolic component from the measurement value 13. In this figure, this calculation process is to be carried out using the personal computer 12. The procedure and equations to be processed are the same as those described in the foregoing.

Incidentally, as described above, the configuration of the measurement value corrector means for storing correction values on the rewritable memory allows a given cyclic function to be set as a correction value, thereby providing a high flexibility. Thus, by improving the calculation method of the correction value in the correction value calculation means to be combined with the measurement value correction means, the configuration provides an advantage of allowing accuracy to be improved possibly to a level close to the limit that can be provided by this correction method.

[Embodiment 2]

Configuration of Automatic Phase Tracking Means for Increasing Accuracy

Figure 7:
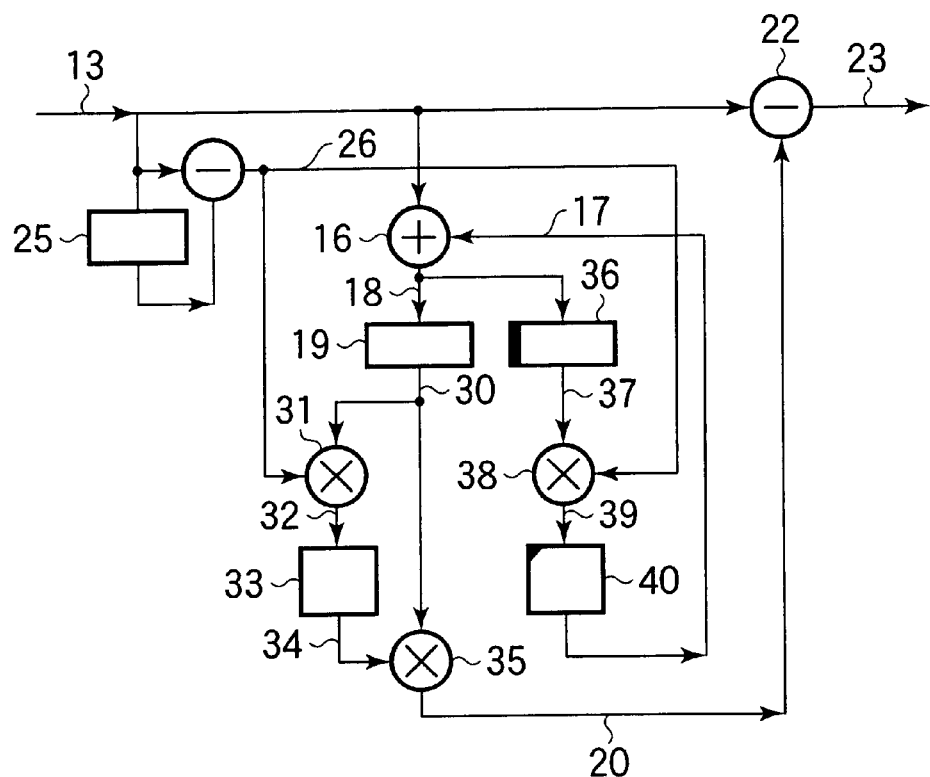
FIG. 7 is a view showing an exemplary relatively simple configuration which allows for an automatic tracking correction in a distortion error correction process according to the present invention.

FIG. 7 shows an exemplary configuration of automatic amplitude tracking distortion correction means which performs feedback control on the phase of cyclic function of a correction value to correct the distortion error of a wave cycle.

The measurement value 13 obtained by the measuring board is captured and then subtracted by the value that has passed through the parabolic component extracting filter 25, thereby providing a distortion error signal 26. This calculation method is the same as that described in Embodiment 1 using the determinant. In addition, the phase shifting value 17 is added to the measurement value 13 in the phase adder 16 to generate the table reference address 18. This value is employed as the input to the memory device 19 for a generating cyclic function value and to a cyclic orthogonal function table 36 having a phase orthogonal to the cyclic function. Incidentally, the memory device 19 may be a ROM (Read Only Memory) having fixed values stored therein. In addition, the memory device 19 and the cyclic orthogonal function table 36 are not limited to the memory device but more generally may be replaced with a function calculation mechanism as far as the mechanism can generate cyclic values. However, the shape of the function to be generated has to be suitable for correction.

A cyclic function value 30 generated as described above and a cyclic orthogonal function value 37 are multiplied by the distortion error signal 26 at multipliers 31, 38 to obtain a correction strength, thereby providing a correlation ratio 32 and a correlation ratio 39 for cyclic orthogonal function. These values are averaged with respect to time in a time-averaging filter 33 and an accumulator 40, thereby making it possible to provide an average correlation strength of each signal component.

Figure 8:
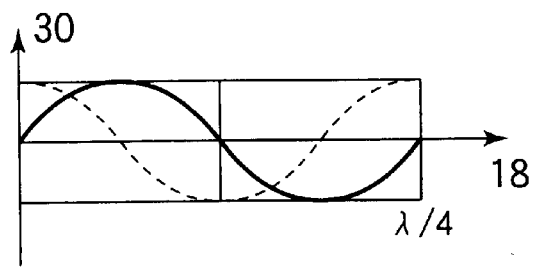
FIG. 8 is a view showing the examples of two cyclic functions (shown by a solid and dotted line, respectively), orthogonal in phase to each other, for use in automatic tracking distortion error correction processing according to the present invention.
Figure 9:
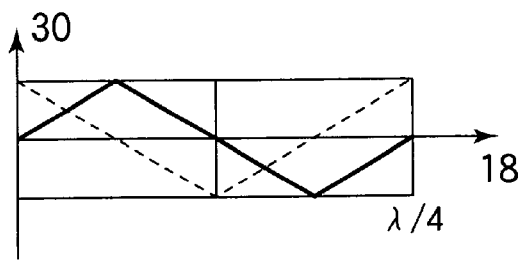
FIG. 9 is a view showing the examples of two cyclic functions (shown by a solid and dotted line, respectively), orthogonal in phase to each other, for use in automatic tracking distortion error correction processing according to the present invention.

An example of appropriate pairs of cyclic functions to be generated at the memory device 19 and the cyclic orthogonal function table 36 is shown in FIGS. 8 and 9. The solid line of FIG. 8 represents a sinusoidal (sin) wave and the dotted line represents a cosine (cos) wave. When a four-fold optical path (in which light travels twice between the interferometer and the reflector) for laser displacement measurement is used, such a function that takes on a cyclic value at each $\lambda/4$ may be employed (where $\lambda$ is the wavelength of the laser)

.For example, the sinusoidal wave is selected as the value to be set to the memory device 19, while the cosine wave is selected as the value to be set to the cyclic orthogonal function table 36. When the sinusoidal wave generated by the memory device 19 lags in phase behind the distortion error signal 26, these settings provide a positive correlation with the cosine wave component orthogonal in phase to the sinusoidal wave, thereby providing the correlation ratio 39 for cyclic orthogonal function with a longer time for taking on a positive value than for taking on a negative value. The correlation ratio 39 for cyclic orthogonal function is added to the accumulator 40, gradually increasing the phase shifting value 17 to be outputted from the accumulator. Accordingly, the table reference address 18 increases to thereby restore the delayed phase. On the contrary, when the sinusoidal wave leads in phase the distortion error signal 26, a reverse operation is carried out to cause a decrease in the address.

This feedback allows the phase of the sinusoidal wave outputted from the memory device 19 to be always consistent with the phase of the fundamental wave component of the distortion error signal 26. Under this condition, oscillatory component of the sinusoidal wave or a correction value is outputted from a multiplier 35 in accordance with an averaged correlation intensity 34 provided by the time-averaging filter 33. The correcting value 20 is subtracted from the original measurement value 13 in the adder/subtractor 22 to provide the displacement value 23 after distortion correction.

Incidentally, as can be seen from FIGS. 3B and 4B, the waveform of the distortion signal appearing in the distortion error signal 26 takes on the shape of a triangular wave rather than a sinusoidal wave. By using a pair of triangular waves (each shown by a solid and dotted line in FIG. 9) having phases different from each other by 90° in place of the sinusoidal and cosine waves shown in FIG. 8, it is possible to carry out correction more efficiently. Thus, a flexibility is given to the selection of a cyclic function.

Incidentally, the automatic phase tracking control can also be implemented with the configuration shown in FIG. 6 or a combination of hardware and software means. The phase adder 16 prepared in front of the memory device 19 can be used to replace the aforementioned phase feedback processing by software-wise processing on the personal computer 12 to thereby implement the distortion correction processing shown in FIG. 7 with the configuration of FIG. 6. In this case, although no mechanism is available for adjusting amplitudes, this mechanism can be implemented by choosing several cyclic function values, which have different amplitudes and are prepared in the dual port RAM 24, in conjunction with the presetting values 21.

[Embodiment 3]
Configuration of Automatic Amplitude Tracking Distortion Corrector Means (1)

Figure 10:
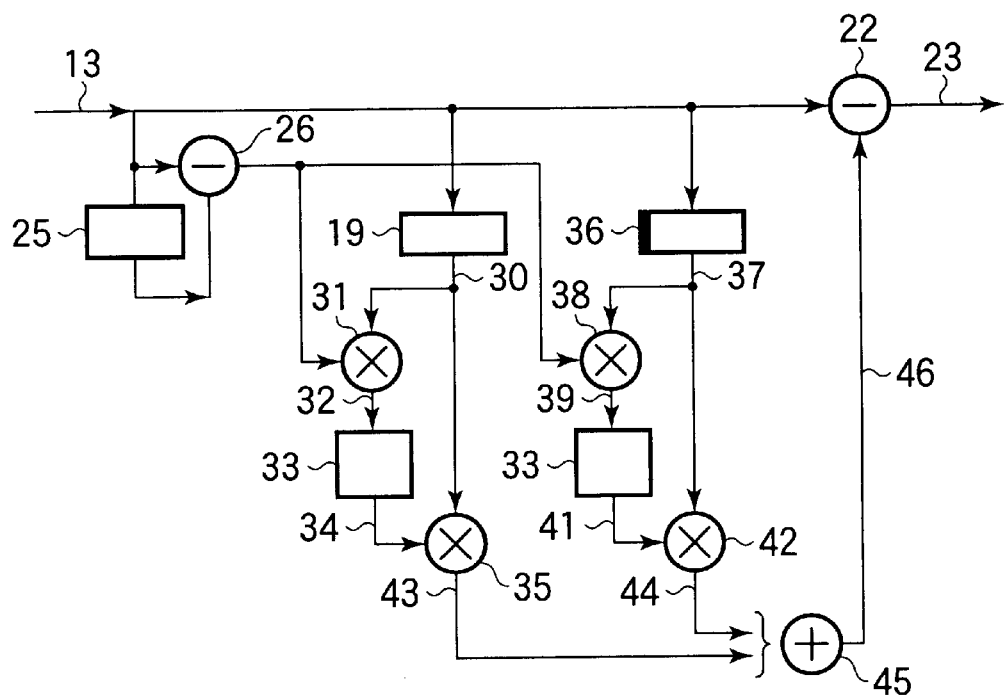
FIG. 10 is a view showing an exemplary configuration of automatic tracking distortion error correction processing according to the present invention, in which employed are two cyclic functions orthogonal in phase to each other.

FIG. 10 shows an exemplary configuration of automatic amplitude tracking distortion corrector means for correcting the distortion error of a measurement value by automatically controlling the amplitude of two cyclic functions.

The measurement value 13 provided by the measuring board is captured and then subtracted by the value that has passed through the parabolic component extracting filter 25 to thereby provide the distortion error signal 26. This calculation method is the same as that described in Embodiment 2. On the other hand, the measurement value 13 is employed as it is to be inputted to the memory device 19 having the two cyclic functions therein and to the cyclic orthogonal function table 36. Each of the generated cyclic function value 30 and the cyclic orthogonal function value 37 is multiplied by the cyclic orthogonal function table 36 at each of the multipliers 31, 38, thereby providing the correlation of each cyclic function component included in the error signal. These correlations represent the correlation ratio 32 and the correlation ratio 39 for cyclic orthogonal function. Each of these values is allowed to pass though the time-averaging filter 33, thereby providing the averaged correlation intensity 34 and an averaged correlation intensity 41 for the cyclic orthogonal function, which represent the magnitude of each cyclic function component. Each cyclic function value is added to each other in proportion to the magnitude of each component. Suppose a combination of a sinusoidal and a cosine wave is used as the cyclic function. In this case, a sinusoidal wave having any phase can be expressed with a linear superposition of these two waveforms. Thus, the phase feedback described in Embodiment 2 with reference to FIG. 7 is not always necessary and the same effect can be provided only by such amplitude control.

The amplitude of the cyclic function value 30 and the cyclic orthogonal function value 37 is varied in accordance with the signal intensity of each component or the averaged correlation intensity 34 and the averaged correlation intensity 41 for cyclic orthogonal function, thereby making the resulting amplitude consistent with the magnitude of each cyclic signal component included in the distortion error signal 26. This is carried out with multipliers 35, 42. As described above, a cyclic function value 43 and an orthogonal cyclic function value 44 are provided as the output of the multipliers. A sum correction value 46 that is obtained by adding each signal component of the cyclic functions in a full adder 45 is subtracted from the original measurement value 13 at the adder/subtractor 22, thereby providing the displacement value 23 after distortion correction with cyclic distortion being eliminated.

As described above, it is possible to configure automatic distortion error corrector means for tracking phases without employing a feedback portion for tracking phases. Incidentally, the two cyclic functions used here, or the sinusoidal and cosine waves, are the same as those shown in FIG. 8 (by a solid and dotted line).

[Embodiment 4]
Configuration of Automatic Amplitude Tracking Distortion Corrector Means (2)

Figure 11:
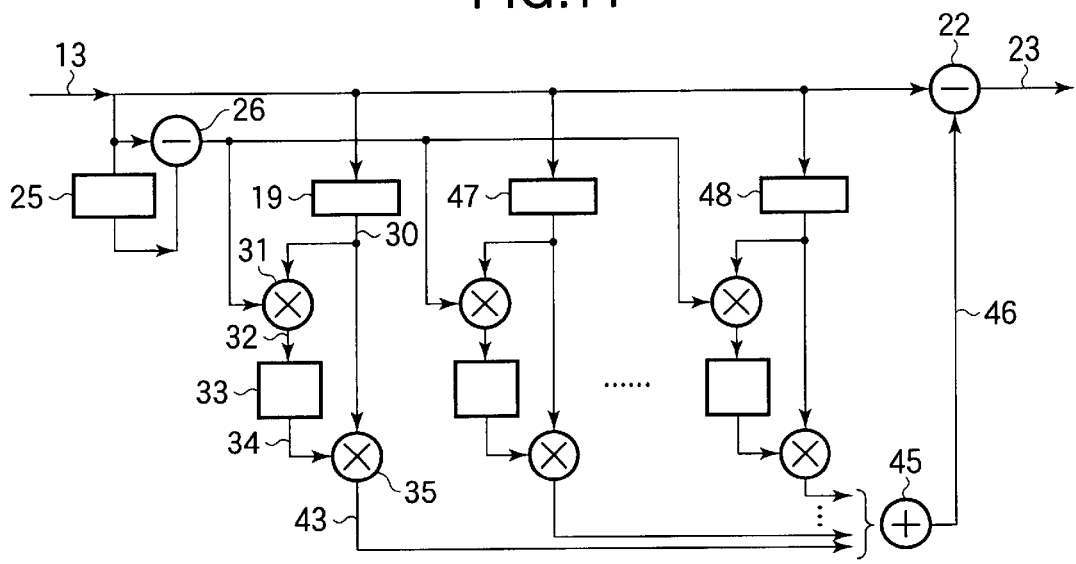
FIG. 11 is a view showing an exemplary configuration of automatic tracking distortion error correction processing according to the present invention, in which employed are three or more cyclic functions orthogonal mathematically to each other.

FIG. 11 shows an exemplary configuration of automatic amplitude tracking distortion corrector means which is configured by expanding the configuration described in Embodiment 3 to automatically control the amplitude of three or more cyclic functions in order to provide further increased accuracy.

Figure 12:
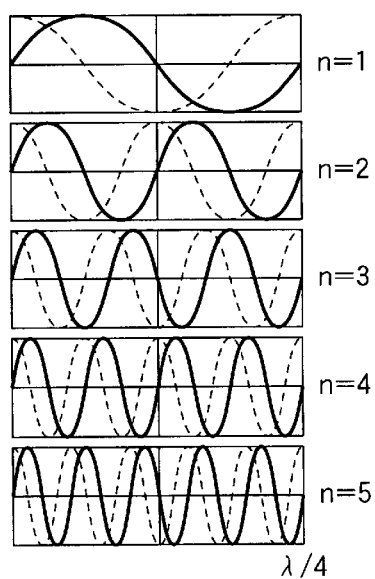
FIG. 12 is a view showing an example of a group of cyclic functions for use in the exemplary configuration of FIG. 11.

Here, the sinusoidal and cosine waves and a group of harmonics of these cyclic functions shown in FIG. 12 are used in place of the two sinusoidal wave and cosine waves, shown in FIG. 8, used in Embodiment 3.

As shown in FIG. 11, the automatic amplitude tracking distortion corrector means is provided with a number of mechanisms, arranged in parallel to each other corresponding to the number of cyclic functions used, for generating the two cyclic functions shown in FIG. 10. Instead of the memory device 19 and the cyclic orthogonal function table 36, this configuration employs the memory device 19 and a plurality of cyclic orthogonal function tables 47, 48. Although FIG. 11 shows only three mechanisms, a required number of mechanisms corresponding to the number of cyclic functions used are arranged in parallel to each other. The configuration subsequent to the full adder 45 is the same as that of FIG. 10.

The sinusoidal and cosine waves and harmonics of these cyclic functions are mathematically orthogonal to each other. This provides an advantage of allowing the intensity of amplitude corresponding to each component to be independently calculated only by the calculation of correlation using an accumulator.

Using a group of orthogonal functions as described above would make it possible to generate a given cyclic function only by the assignment of weights to and addition of each cyclic function. The orthogonality makes it possible to separately determine the intensity of the component corresponding to each function by means of an accumulator. Furthermore, the value of three or more cyclic functions including harmonics thereof can be added to thereby track a distortion error signal having finer irregularities and reproduce the shape of the distortion error signal with a higher fidelity. This provides an advantage of reducing a residual or a distortion error by subtraction to thereby increase accuracy.

Figure 13:
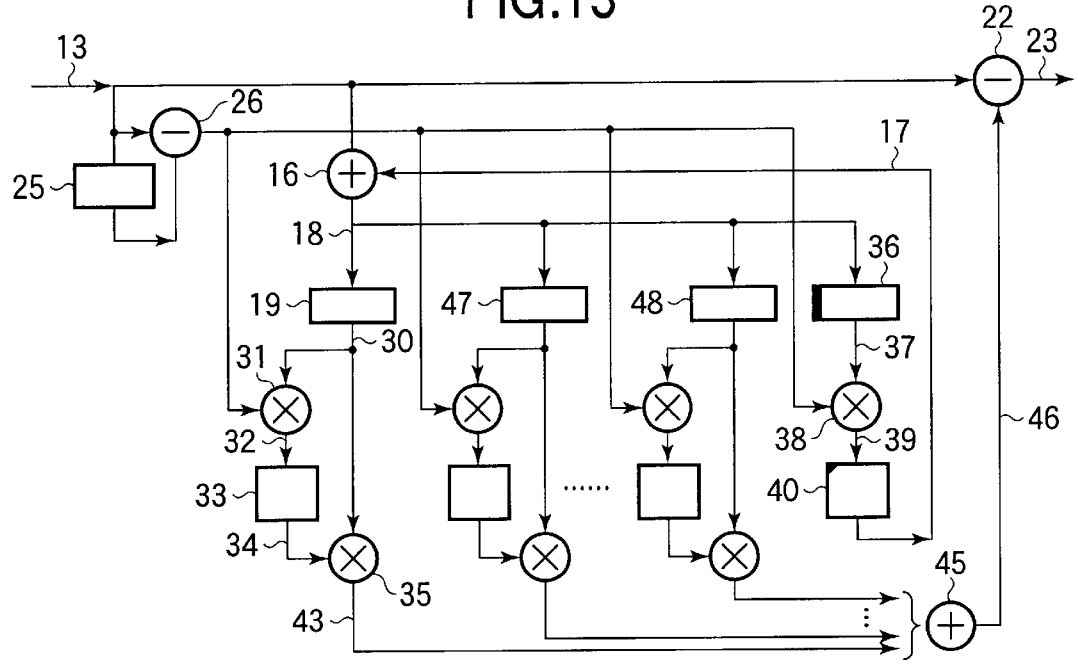
FIG. 13 is a view showing an exemplary configuration of automatic tracking distortion error correction processing means according to the present invention, in which the amplitude control of a plurality of cyclic functions orthogonal to each other is combined with the phase tracking control.

[Embodiment 5]
Configuration of Combined Corrector Means of Automatic Amplitude Tracking and Phase Tracking FIG. 13 shows an exemplary configuration of combined automatic distortion corrector means, in which automatic amplitude tracking control and automatic phase tracking control are combined with each other using a plurality of orthogonal cyclic functions.

In this configuration, the phase tracking feedback portion shown in FIG. 7 and the amplitude control of the plurality of cyclic functions shown in FIG. 11 are combined with each other. The flow of signal and function of each portion are the same in each of the portions bearing the same reference numbers of the embodiments 2 and 4. With such a configuration, it is possible to select a given group of orthogonal cyclic functions other than sinusoidal and cosine waves as the group of cyclic functions to be used.

An example of a cyclic function to be used in this embodiment includes a group of orthogonal harmonics of a triangular-wave cyclic function. The triangular wave having been shown in FIG. 9 (by a solid line) is expressed in the form of the following equation 3. That is,

[Equation 3]

$$y = \text{Tri}(x)$$

where x is the horizontal axis and y is the vertical axis.

With the group of orthogonal harmonics of a triangular-wave cyclic function being expressed in the form of equation 4 (where n is a natural number), each of the harmonic cyclic functions having n=1 to 8 is expressed in the form of equation 5.

[Equation 4]

$$y = \text{orthoTri}(nx)$$

[Equation 5]

$$\text{orthoTri}(1x) = \text{Tri}(1x)$$

$$\text{orthoTri}(2x) = \text{Tri}(2x)$$

$$\text{orthoTri}(3x) = \text{Tri}(3x) + \tfrac{1}{9}\text{Tri}(1x)$$

$$\text{orthoTri}(4x) = \text{Tri}(4x)$$

$$\text{orthoTri}(5x) = \text{Tri}(5x) - \tfrac{1}{25}\text{Tri}(1x)$$

$$\text{orthoTri}(6x) = \text{Tri}(6x) + \tfrac{1}{9}\text{Tri}(2x)$$

$$\text{orthoTri}(7x) = \text{Tri}(7x) + \tfrac{1}{49}\text{Tri}(1x)$$

$$\text{orthoTri}(8x) = \text{Tri}(8x)$$

Figure 14:
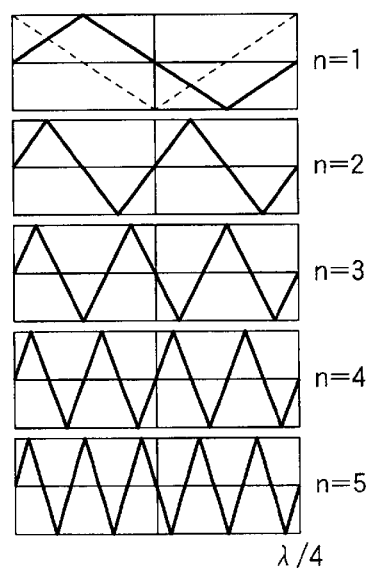
FIG. 14 is a view showing an example of a group of cyclic functions for use in the exemplary configuration of FIG. 13.

These functions are specifically shown in FIG. 14. All of these functions look a triangular-wave harmonic cyclic function with the vertex of each triangular wave being slightly shifted vertically due to their orthogonality. Each of these orthogonal functions is selected so as to provide zero to the integration of the product of one function and another over one cycle in the interval from 0 to $\lambda/4$.

The cyclic orthogonal function table 36 may generate a triangular-wave function of n=1, shown by a dotted line in FIG. 14, or a cosine-wave function of n1, shown by a dotted line in FIG. 12.

The method shown in Embodiment 4 requires both harmonic cyclic functions of sinusoidal and cosine waves to provide phase flexibility to increase accuracy, thereby requiring an arrangement for generating a number of cyclic functions. In contrast to this, from the viewpoint of phase, the method shown in this embodiment simplifies the configuration only by the addition of one feedback system to reduce the number of cyclic functions by one-half. Furthermore, the method does not need to be bound to a function such as a sinusoidal wave that can provide a given shift in phase by superposition, thus making it possible to employ from the beginning a triangular wave close to a distortion error wave as a cyclic function. This makes it possible to reproduce efficiently the waveform of a distortion error signal including a number of triangular wave components by means of a relatively small number of cyclic function value generating means (the memory device 19 or the cyclic orthogonal function tables 47, 48). Thus, this provides an advantage of simplifying the configuration and reducing costs.

Incidentally, in this automatic phase tracking distortion correction, the feedback control can be stabilized by setting feedback time to a value slightly shorter than the time constant of the time-averaging filter 33 for use in amplitude control. Here, the feedback time for feedback adjustment to provide phase consistency is determined by the integral time constant of the accumulator 40.

[Embodiment 6]
Configuration Combined with Noise Reduction Averaging Means

Figure 15:
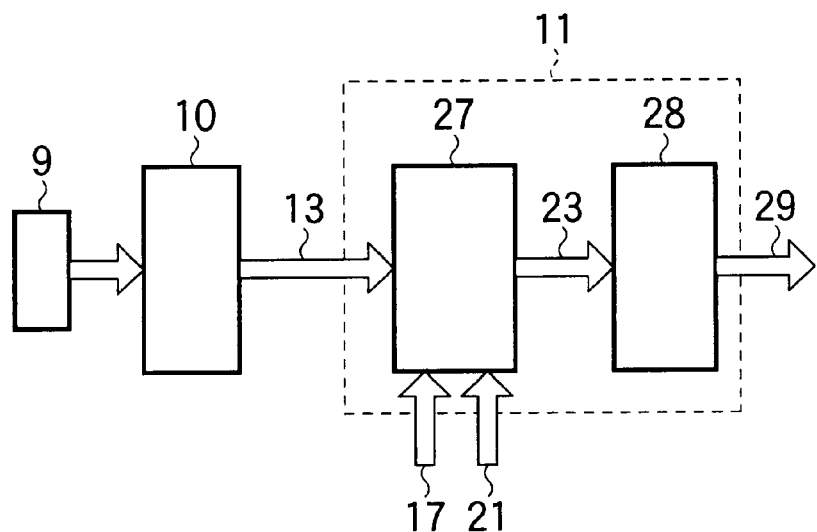
FIG. 15 is a view showing the order of connection in the signal processing for the combination of distortion corrector means and averaging means according to the present invention.

FIG. 15 shows an exemplary configuration having a combination of distortion corrector means 27 described in Embodiments 1 to 5 and averaging unit (averaging means) 28 for processing noise, allowing for measurement at higher resolution than the minimum resolution of the original measurement value 13.

The averaging means 28 receives and then allows the displacement value 23 after distortion correction, provided by the distortion corrector means 27, to be averaged for output by the method of moving averages in the digital averaging unit incorporated therein over the same average time as the excitation cycle of lasing. More specifically, the hardware configuration we have used provides the displacement value 23 after distortion correction in the form of coordinates data of 32 bits in a 0.1 $\mu$s cycle. The value is averaged by the method of moving averages by means of hardware over an average time of 14.6 $\mu$s, which is the same as the excitation cycle of lasing.

Figure 16:
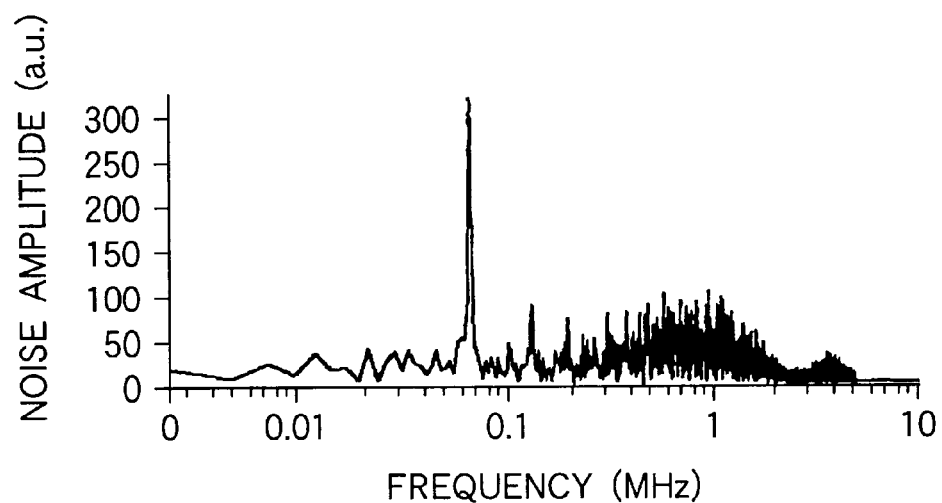
FIG. 16 is a view showing the frequency spectrum of a coordinate displacement signal with a stage being at a standstill before processing is performed by averaging means.

FIG. 16 shows the frequency spectrum of a signal of the displacement value 23 after distortion correction with the stage at a standstill. As can be seen in the figure, in addition to fine noise around 1 MHz, a high sharp noise component corresponding to the excitation frequency of the gas laser appears frequently near 68 kHz. Accordingly, for example, a filter having such a frequency characteristic as shown in equation 6 below is used for averaging.

$$\left| \frac{\sin(2\pi \Delta \tau \cdot f)}{2\pi \Delta \tau \cdot f} \right| \quad \text{[Equation 6]}$$

where $\Delta \tau$ is the time constant of the filter and f is the frequency.

Specifically, a moving average filter may be employed as the filter having the characteristic shown in the above equation. The average time can be determined to be 14.6 $\mu$s corresponding to the cycle of 68 kHz, thereby making it possible to eliminate the excitation noise of the aforementioned gas laser. Incidentally, the aforementioned average time corresponds to 2 $\Delta \tau$.

The averaging filter produces a response delay and phase shift and therefore the distortion correction processing described in Embodiments 1 to 5 has to be performed before this averaging processing. For this reason, to use the averaging process in combination with the distortion correction processing, the distortion correction processing has to be performed before the averaging processing as shown in FIG. 16.

Furthermore, suppose the system is configured such that only the measurement value 29 with increased accuracy or a final output can be detected externally as coordinates output value. In this case, since the phase shift occurs as described above by allowing the value to pass through the averaging means 28, the system is desirably configured to allow the value to bypass the averaging means 28 at the time of calculating a correction value. Similarly, at the time of calculating a correction value, the reference of the output value that has been corrected with the previous correction value would make the calculation of the correction value further complicated. To prevent this, it would provide an increased flexibility that the distortion corrector means 27 itself can control whether or not the correction value is to be added.

Figure 17:
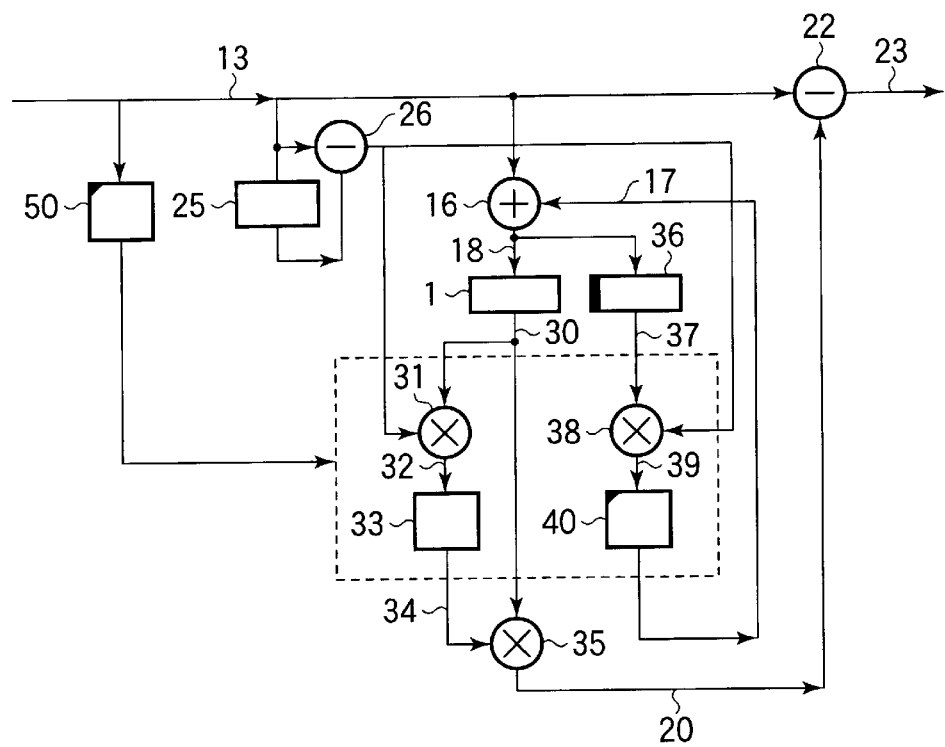
FIG. 17 is a view showing an exemplary configuration comprising means which is referenced as an input to averaging processing only when a certain traveling speed of a stage is exceeded in the automatic tracking correction processing of distortion error.

Incidentally, such a prediction of distortion error (calculation of a correction value) would work properly only when the stage is moving smoothly in a continuous manner at a given constant speed (more specifically at 2 mm per second or greater). Use of a continuous coordinates output value measured at some other time would cause the error contained in the value to be increased due to the mechanical vibration, acceleration, or deceleration of the stage. Suppose the stage moves at a given constant speed or less in the automatic tracking correction processing of a distortion error shown in Embodiments 2 to 5. When the stage moves at a lower speed, it is desirable to provide means for the time-averaging filters 33, 40 shown in FIGS. 7, 10, 11, and 13 either to lock the average value without referencing the input value or to reference on a priority basis the input value as the input of the averaging processing only when the stage moves at a given speed or greater. For this purpose, for example, as shown in FIG. 17 corresponding to FIG. 7, the system may be configured to differentiate the measurement value 13 with a derivation filter 50 and issue an enable signal for activating the time-averaging filters 33, 40 only when the value (the traveling speed of the stage) exceeds a certain given threshold value.

In addition, from that viewpoint, in the system employing the means for increasing displacement output value accuracy according to the present invention, it is desirable for the stage or a measurement subject to be able to move smoothly in a continuous manner at an apparently constant speed (more specifically, at a speed variation ratio of 0.05% or less) at the time of setting or resetting the correction value. It is thus desirable to incorporate the movement of the stage and the measurement target subject and the measurement processing for this purpose into the process (procedure) to be performed at the time of initialization and correction. That is, the process (procedure) can be implemented only in the system having a laser interferometer displacement measuring system integrated with driving means. On the other hand, smooth movement of the stage would not necessarily require a constant speed thereof. A nearly constant speed would make it easier to carry out an error calculation by the subtraction of a parabolic component with accuracy and allow for a linear fitting instead of a parabolic fitting, thus facilitating calculation.

As shown in the foregoing, the method according to the present invention allows a laser interferometer displacement measuring system to be provided with a reduced cyclic measurement error caused by the interference effect of laser, thereby implementing a higher absolute measurement accuracy than before. Incidentally, in the foregoing, the present invention has been explained with reference to an example with a four-fold optical path (in which light travels twice between the interferometer 5 and the reflector 8) for laser displacement measurement, employing $\lambda/4$ as the fundamental cycle of a cyclic function (where $\lambda$ is the wavelength of the laser).

With a two-fold optical path (in which light travels once between the interferometer 5 and the reflector 8) for laser displacement measurement, the fundamental cycle of a cyclic function is $\lambda/2$. In general, the fundamental cycle of a cyclic function is $\lambda/n$ with an n-fold optical path (in which light travels n times between the interferometer 5 and the reflector 8) for laser displacement measurement.

According to the present invention, it is possible to provide improved measurement accuracy to devices employing a laser interferometer displacement measuring system. Thus, the present invention is applicable to mechanisms or devices, which require among other things a considerably high absolute accuracy, such as a single-axis stage, an X-Y stage, a multi-axis stage, an electron beam lithography apparatus, a stepper for fabricating semiconductors, a fine patterning equipment, precision patterning equipment, metal machining equipment, ceramic machining equipment, mask pattern transfer equipment, mask patterning equipment, an electron-beam scanning microscope with a displacement measurement function, a transmission electron microscope, and non-contact shape measurement equipment.

The laser interferometer displacement measuring system has originally a high absolute accuracy in the range of a longer distance than the wavelength of laser light, and in conjunction with the present invention, the absolute accuracy can be improved in the scale of the frequency or less. This makes it possible to provide high accuracy devices with improved machining accuracy.

Suppose the distortion correction processing according to the present invention is performed in accordance with a measurement result provided by the laser interferometer displacement measuring system upon control of movement of the stage or a measurement subject. In this case, performing the distortion correction processing on feedback control would make it possible to prevent the occurrence of unnecessary lasing by a cyclic measurement distortion component in the laser displacement measurement, thus providing an advantage of facilitating readily the stability of control.

[Embodiment 7]
Configuration of Laser Interferometer Displacement Measuring System Employing Phase Detection FIGS. 18 to 22 show the exemplary configuration of a laser interferometer displacement measuring system employing a phase meter equipped with a phase tracking circuit (PLL or Phase-Locked Loop). The exemplary configurations of FIGS. 18 to 21 show a laser interferometer displacement measuring system in which the displacement of a subject body having the reflector 8 causes a four-fold change in length of the optical path to the optical path length of the measurement path beam between the interferometer and the subject body. FIG. 22 shows an optical system in which a displacement of the subject body causes an eight-fold change in length of the optical path. Incidentally, the optical system with either the four-fold or eight-fold optical path has the same configuration of the signal processing system subsequent to the light detector 9.

Now, described below is the principle of the aforementioned laser interferometer displacement measuring system according to the present invention. First, referring to FIG. 21, the configuration of the optical system is described.

The laser light 3 emitted from the gas laser light source 2 impinges upon a polarizing beam splitter 51a. The laser light is linearly polarized and provided with a polarization at an angle of 45 with respect to the polarizing beam splitter 51a. The laser light is split into two beams: one beam (reference path beam) to be reflected on the polarizing beam splitter 51a towards a retroreflector 52a and the other beam (measurement path beam) to be transmitted as it is towards a polarizing beam splitter 51b. The reference path beam reflected towards the retroreflector 52a is reflected twice in the retroreflector to return to the optical path on the upper side of the polarizing beam splitter 51a, then being reflected to the right at the reflecting plane of the polarizing beam splitter 51a to impinge upon the light detector 9. On the other hand, the measurement path beam transmitted towards the polarizing beam splitter 51b passes through the subsequent polarizing beam splitter 51b as it is and then a quarter wave plate 53, being polarized circularly to reach the reflector 8. Upon being reflected on the reflector 8 and then passing again through the quarter wave plate 53, the measurement path beam, circularly polarized, is rotated by 90° with respect to the original polarization. The laser light with a polarization rotated by 90° is reflected on the reflecting surface of the polarizing beam splitter 51b towards a retroreflector 52b. Then, this light is reflected twice in the retroreflector 52b to return to the optical path on the upper side of the polarizing beam splitter 51b. The light, still having the polarization rotated by 90°, is reflected to the left at the reflecting plane of the polarizing beam splitter 51b and then passes through the quarter wave plate 53 to reach again the reflector 8 being circularly polarized. Then, upon being reflected on the reflector 8 to pass again through the quarter wave plate 53, this light is rotated again by 90° to be provided with the original polarization and then passes through the polarizing beam splitter 51b as it is. Then, the light passes through the polarizing beam splitter 51a as it is to reach the light detector 9. At this time, the light is mixed with the reference path beam that has first reached there via the retroreflector 52a to optically interfere with each other. A light beam provided with an alternating light and dark pattern by the interference of light is collected by and detected in the light detector 9. Incidentally, it is to be understood here that the light detector 9 also has the function of an optical detector. It is also to be understood that a detected signal of the optical detector or a signal indicative of an analog quantity proportional to the amount of light received is referred to as a signal indicative of the amount of light received.

The path between the quarter wave plate and the reflector 8 is referred to as a measurement path 70. Since the measurement path beam travels twice along the measurement path 70, a displacement in the reflector 8 causes a four-fold variation in the length of the optical path, through which the measurement path beam passes, with respect to the displacement of the reflector 8. This causes a displacement of λ/4 in the reflector 8 to produce a phase difference between the measurement and reference path beams to thereby allow interference of laser light to occur, resulting in a blink of the light detected by the light detector 9. The count of the blinks makes it possible to measure a variation in length of the measurement optical path. For light of wavelength 633 nm, one blink corresponds to a displacement of 158 nm. To measure a displacement with an accuracy of 1 nm, it is necessary to measure this light blink accurately at a higher resolution than one wavelength. For this purpose, phase detector means such as a phase meter is generally provided using synchronization detection such as with a phase-locked loop (PLL). By this signal processing, the phase variation of the measurement and reference path beams is accurately measured.

Now, the configuration subsequent to the light detector 9 is explained with reference to FIG. 18.

Variations in intensity of the blinks detected by the light detector 9 are inputted into phase detector means 55 as a photodetector detection signal 54. As described above, the phase detector means 55 measures accurately the phase difference between the measurement and reference path beams in accordance with the variation in intensity of interference light corresponding to the light blinks in order to determine a phase value 56. The amount of variations in the phase value 56 is accumulated in accumulator means 57 to determine an accumulated value 58 corresponding to the displacement of the reflector. The accumulated value 58, close to the measurement value 13, has an error caused by the optical system or circuitry. To configure a high accuracy laser interferometer displacement measuring system, it is necessary to eliminate errors contained in the accumulated value 58 by correction. The laser interferometer displacement measuring system according to the present invention is provided with a correction function for reducing these errors. As shown in Embodiment 1, the aforementioned accumulated value 58 often includes an error mainly composed of wavelength λ of the laser light or harmonics thereof. In general, in a laser interferometer displacement measuring system, the aforementioned accumulated value 58 is provided in the form of the sum of an integral multiple of wavelength and the dividing ratio of one wavelength. This is because the laser interferometer displacement measuring system counts a distance by the number of wavelengths. Therefore, it is generally easy to obtain cyclic components of wavelength λ of the laser light from the aforementioned accumulated value. The cyclic components of wavelength λ of the laser light are detected synchronously from the accumulated value 58. When a vibration component is found which has a frequency that never appears under a normal condition, it can be determined mechanically that the component is the error of the laser interferometer displacement measuring system. A correction value generator means 61 performs the foregoing. The approach described in Embodiments 1 to 6 can be used for this purpose. A correction value 60 obtained by the correction value generator means 61 is added to the aforementioned accumulated value 58 by means of a correction value adder 59, thereby providing the measurement value 13 with increased accuracy.

Figure 18:
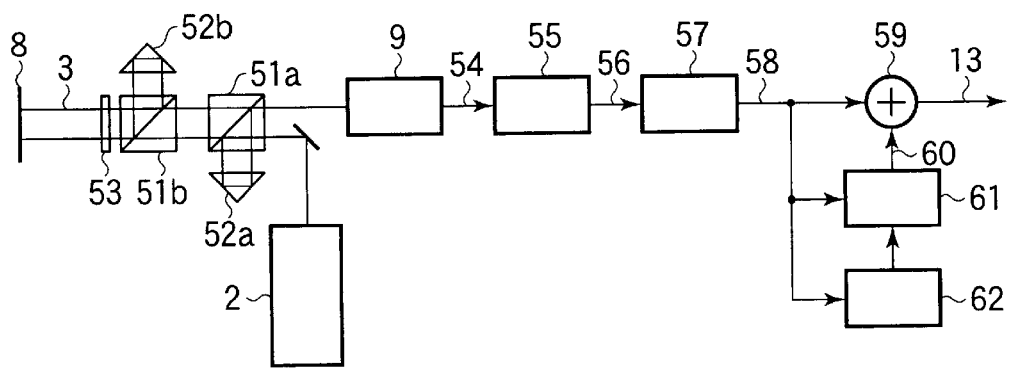
FIG. 18 is a view showing the overall exemplary configuration in which a laser interferometer displacement measuring system according to the present invention is configured using phase measurement means (phasemeter)
Figure 19:
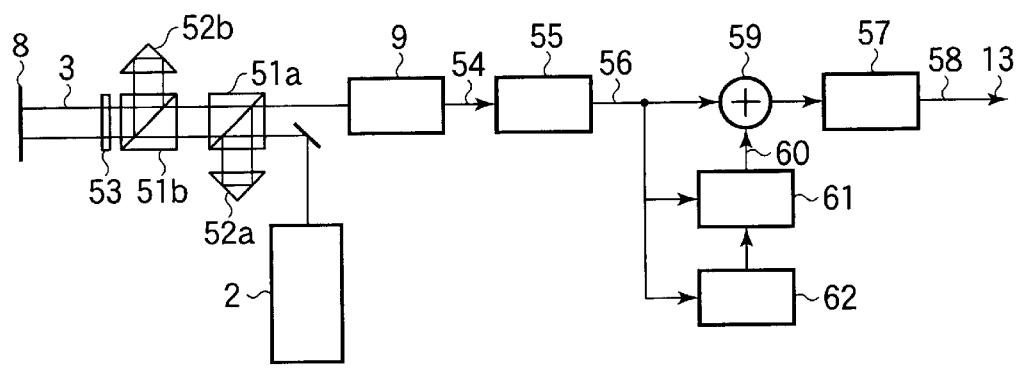
FIG. 19 is a view showing the overall exemplary configuration of a laser interferometer displacement measuring system for implementing a correction method in which a correction value is generated employing a phase value as a variable to add the resulting correction value to the phase value.
Figure 20:
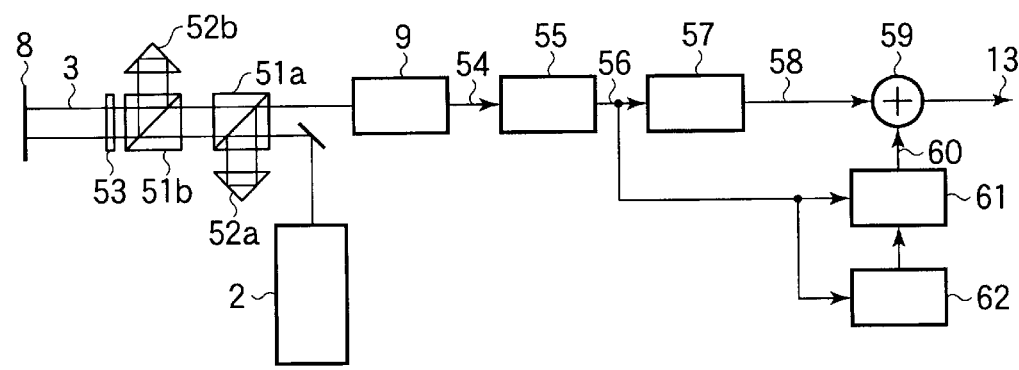
FIG. 20 is a view showing the overall exemplary configuration of a laser interferometer displacement measuring system for implementing a correction method in which a correction value is generated employing a phase value as a variable to add the resulting correction value to an accumulated value.

Incidentally, as an alternative configuration to that of FIG. 18, there is available another configuration, as shown in FIG. 19, in which the correction value adder 59 is inserted in between the phase detector means 55 and an accumulator (accumulator means) 57 to generate the correction value 60 with the phase value 56 being employed as a variable and then the resulting value is added to the phase value 56 itself. On the other hand, FIG. 20 shows a configuration in which the correction value adder 59 is arranged behind the accumulator means 57 to add the resulting value to the accumulated value 58. However, in these configurations, the phase value 56 is employed as a variable to generate the correction value 60, thereby limiting to less than λ/4 the cycle of the correction value to be added. The configuration shown in FIG. 18 provides an advantage of being available for an error of a decreased cycle.

Now, the cause of occurrence of measurement error will be explained below referring back to FIG. 21.

The configuration of the optical system of the laser interferometer displacement measuring system shown in FIG. 21 usually employs lens components that are applied with non-reflective coating to prevent unnecessary reflection of light. However, an error or unevenness in thickness of the non-reflective coating would often result in 1 to 2% reflection of light at each of the boundaries between air and lens components. Among the reflected beams of light, surface-reflected light 71 reflected on the surface of the quarter wave plate 53 opposite to the reflector affects directly the measurement error of this optical system. Except that the surface-reflected light 71 does not travel along the measurement path 70, the surface-reflected light 71 is rotationally polarized at the surface on the reflector side of the quarter wave plate 53 in the same manner as a usual measurement path beam and then travels along the same optical path to be detected by the light detector 9. The same thing occurs when light passes through the quarter wave plate for the second time, causing surface-reflected light 72 to be produced. Suppose a variation in length of the optical path, caused by the movement of the subject body, of the measurement path beam of each light component is expressed to be N times the displacement of the subject body. Thus, the beams of surface-reflected light 71, 72, which travel once (N=2) and are mixed with a measurement path beam (N=4) that is supposed to travel twice along the measurement path 70, are detected by the light detector 9, causing an error in the displacement measurement.

The same thing happens when light travels three times or more along the measurement path as shown in FIG. 22. FIG. 22 shows an example of an increased number of travels of light along the measurement optical path to increase the resolution of measurement, showing an exemplary configuration of an optical system in which a measurement path beam travels four times along the measurement path 70. In this case, 4 to 8% of light traveling three times (N=6), mixed with the light traveling four times (N=8), is detected by the light detector 9, causing an error in the displacement measurement. Similarly, light of N=4 or N=2 is also contained to cause an error of the measurement.

Figure 23:
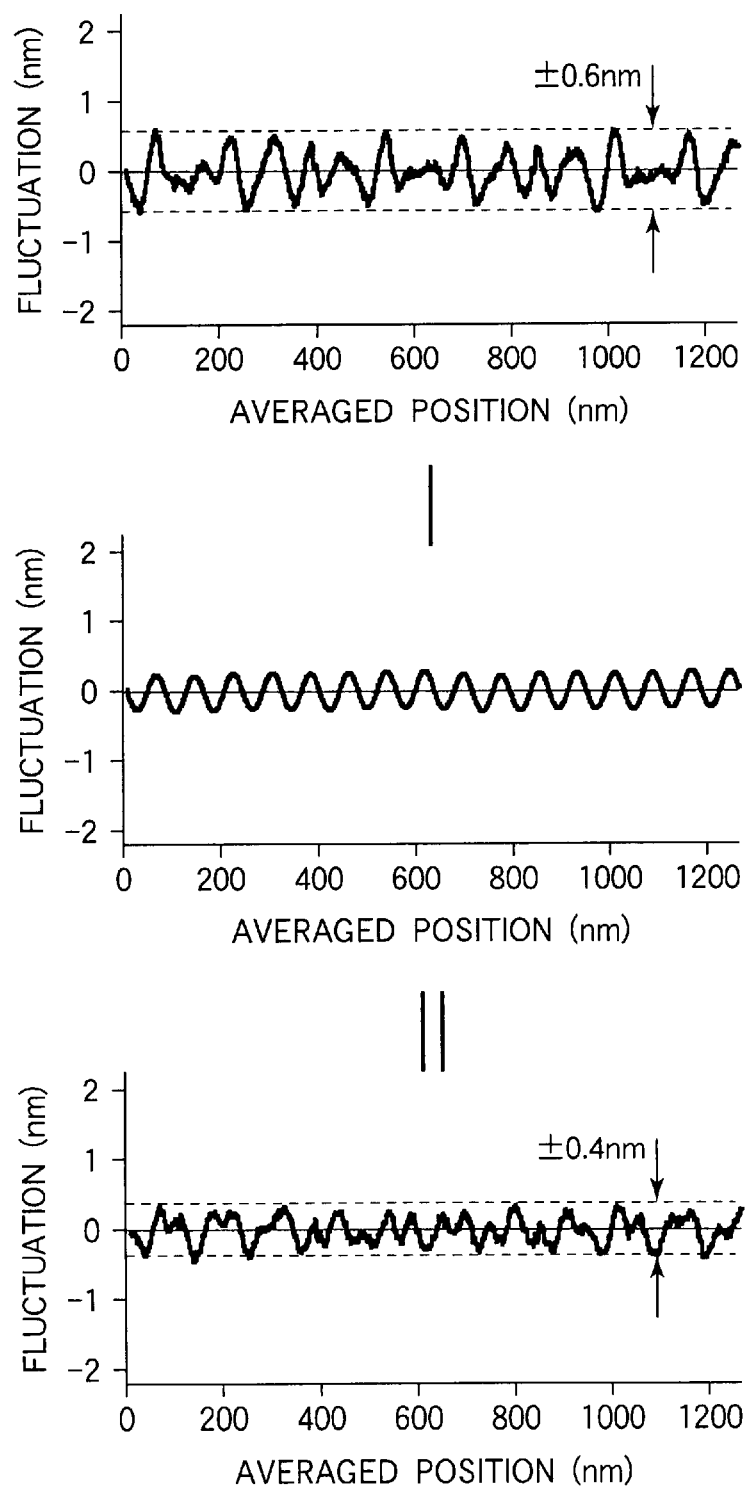
FIG. 23 is a view showing an actual example of a correction result provided when the sum of cyclic functions of 1 to 2 n harmonic waves is employed as a correction value.

Contemporary techniques cannot completely eliminate these optical errors in the optical system. Therefore, these errors are desirably eliminated by means of signal processing. More specifically, the configuration as shown in FIG. 18 can be used for this purpose. As described above, light of N=8 is mixed such as with light of N=6 and N=4. For example, mixing of light N=2 and N=4 would cause a beat to occur due to a component wave of N=(4+2)/2=3 and a component wave of N=(4−2)/2=1. This causes an error of a long cycle corresponding to N=1(i.e., a cycle of λ). To eliminate this error, it is desirable to generate the correction value 60 not with the phase value 56 detected in the cycle of N=8 but with the accumulated value 58 being employed as a variable. In addition, an error in the shape of a triangular wave as shown in FIG. 4 means that a number of 2N-harmonic sinusoidal components are contained in addition to N-harmonic components. In order to eliminate these components, it is desirable that a plurality of sinusoidal waves to be employed as a correction value should contain 1 to 2 n harmonic sinusoidal wave components. In this regard, the correction method shown in Embodiment 4 is available which employs the sum of a plurality of harmonic cyclic functions as a correction value. Actual examples of the effects of this correction method are shown in FIG. 23. The measurement accuracy in the range of ±0.6 nm as shown in FIG. 1 is further increased up to the range of ±0.4 nm by employing the sum of 1 to 2 harmonic sinusoidal and cosine waves as the correction value 60. Configuration for correcting each of the 1 to 2 n harmonic components makes it possible to further increase accuracy as mentioned above when compared with the correction of a single sinusoidal component.

Figure 26:
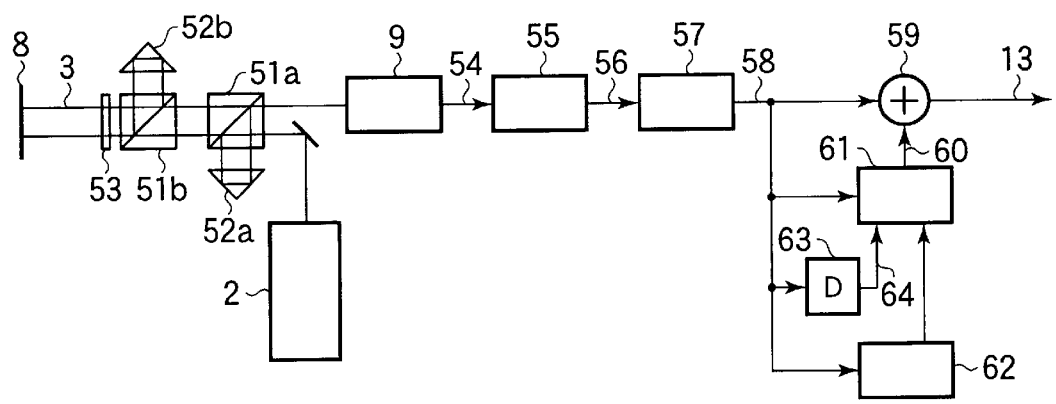
FIG. 26 is a view showing the entire exemplary configuration of a laser interferometer displacement measuring system according to the present invention, which employs a method for performing automatic tracking of and updating a correction value to provide increased accuracy.
Figure 27:
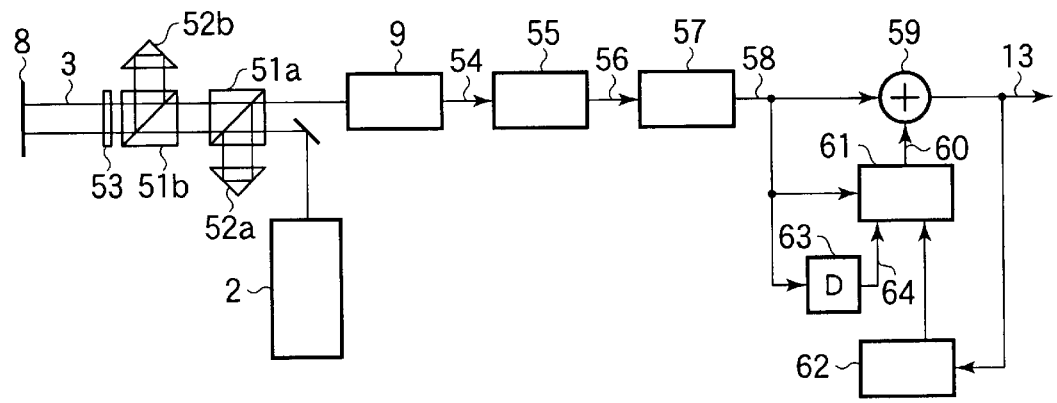
FIG. 27 is a view showing the entire exemplary configuration of a laser interferometer displacement measuring system according to the present invention, which employs a method for performing an automatic feedback of a correction value to provide increased accuracy.

On the other hand, the configuration of the automatic tracking corrector means as shown in Embodiments 2 to 5 will inevitably produce a time delay from the time of detecting these cyclic error components resulted from the movement of the stage until the components converges on an optimum correction value. More specifically, the system is started, the stage is then move, a signal of a λ cycle component is detected, a correction value is calculated or adjusted, and thereafter outputted is a measurement value with increased accuracy provided by the correction value. Accordingly, immediately after the system has been started, the movement of the stage will first allow measurement values containing a number of error components of a λ cycle to be outputted, and after a while, corrected measurement values with less errors will be outputted. The delay time is determined by the feedback time of the automatic tracking system as described in Embodiment 5. However, when the stage is at a standstill or moves slowly, it is impossible to distinguish an oscillation signal resulted from interference of light from a vibration signal caused by mechanical vibration. In this regard, required is means for enabling or disabling the update of correction values based on the traveling speed of the stage. This is more specifically shown in FIG. 26. Derivator means 63 is allowed to detect the speed of the stage based on a variation in the accumulated value 58, and then an update enabling signal 64 is outputted to update the correction value when the speed has exceeded a given speed. FIG. 27 shows an exemplary configuration in which a λ-synchronous signal extractor (λ-synchronous signal extractor means) 62 detects an error of a wavelength λ cycle that is included in the measurement value 13 and remains after correction, and feedback control is performed to minimize the error. The update enable signal 64 controls the update of the correction value in accordance with the speed of the subject body (stage). This makes it possible to prevent accidental update of the correction value at the time of low speeds. Such a configuration allows the error of a λ cycle to be continuously suppressed even after the stage has been slowed down, thereby making it possible to improve the measurement accuracy upon measurement with the stage at a standstill.

As described above, the configuration of the laser interferometer displacement measuring system according to the present invention is characterized by comprising calculation means for calculating a correction value for correction of the measurement value of displacement of a subject body and an addition mechanism for adding the correction value. The configuration is also characterized by adding or subtracting a cyclic correction value that is in phase with the fundamental wavelength λ of laser light. A laser interferometer displacement measuring system with a multi-fold optical path can also have a measurement value with increased accuracy. This configuration comprises inevitably the calculation means for calculating and adder/subtractor means for adding or subtracting a correction value, which follow phase detection. An error signal included in the measurement value is determined and the resulting error signal is added or subtracted as a correction value, thereby providing the measurement value with increased accuracy. The feature of the error signal makes it possible to implement high accuracy non-contact displacement measurement in the range of error±0.4 nm or less by subtracting 1 to 2 n harmonic wave components of the wavelength λ of laser light, independent of n, using a cyclic correction value that employs the wavelength λ of laser light as a fundamental cycle. Correction value generator means can employ a method for generating a cyclic correction value having the cycle of the wavelength λ of laser light, with a phase value or an accumulated value being employed as a variable. Furthermore, available for generating correction values is an approach for synchronously detecting a frequency signal component of the cycle of wavelength λ, which is contained in a time-dependent accumulated value. In addition, it is also possible to automatically generate a correction value by automatic tracking so as to minimize the signal component with the cycle of wavelength λ, which is contained in the corrected signal. In this case, since tracking is carried out so as to reduce the signal component having a frequency component of cycle λ contained in a measurement value after the subject body has moved, the frequency component of the measurement value varies with time.

Figure 28A:
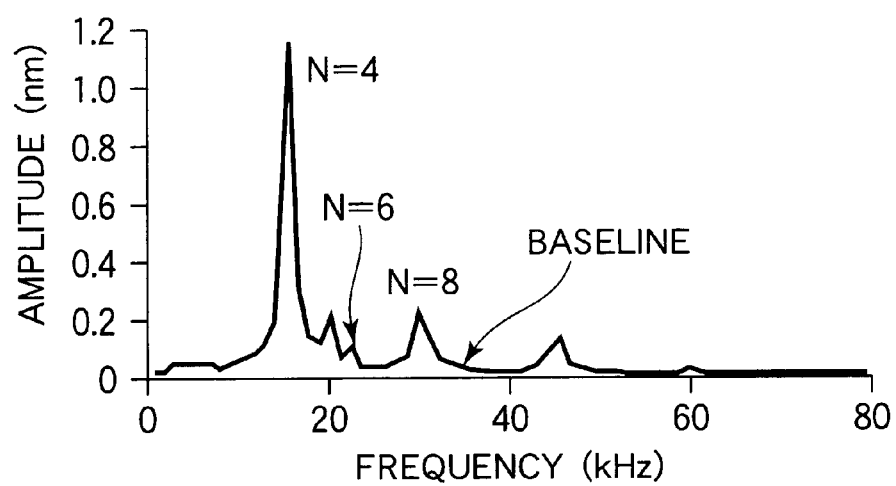
FIG. 28A showing an example without an accuracy improvement method according to the present invention, FIG. 28B showing the other example with the method.
Figure 28B:
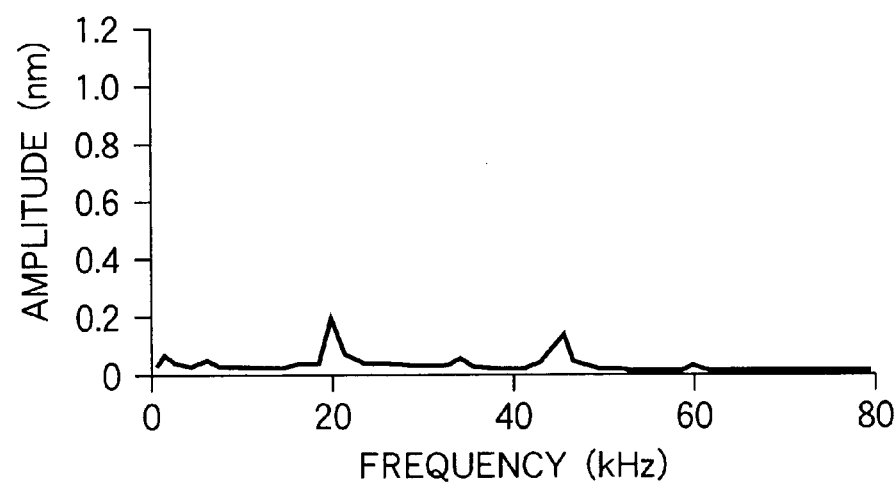
FIG. 28 are views showing examples of frequency spectrum of a measurement value.

The frequency f of the signal produced at a cycle of wavelength λ is determined by the traveling speed v of the stage as f=Nv/λ (where N is a natural number) and can be therefore distinguished clearly from vibration signals caused by other factors. With the averaging filter, a cut-off frequency that is so set as to eliminate the component of frequency f would cause signals in the frequency band greater than f to be attenuated at the same time, thereby eliminating signals which are caused by other oscillation factors and are originally to be detected. In contrast, the corrector means according to the present invention is characterized in that only an error signal caused by interference of light can be detected by synchronous detection such as lock-in detection and eliminated, thereby making it possible to correct the error signal without attenuating signals which are caused by a mechanical vibration and are originally to be detected. An actual example is shown in FIG. 28. The displacement of the stage is measured during the movement of the stage and the resulting signals before and after correction are expressed in the graphs of frequency spectrum. As shown in FIG. 28A, peaks of f=NV/λ are observed at equal intervals in the signal before correction. On the other hand, in FIG. 28B, those peaks at equal intervals have been eliminated in the corrected spectrum but the signals of other high frequency band components have not been attenuated. Thus, only such peaks of frequency f=Nv/λ in phase with wavelength λ can be selectively eliminated, thereby making it possible to carry out correction without attenuating the peaks of a frequency component caused by other factors. In general, when averaging applied to noise processing is carried out to attenuate a peak of a certain frequency, signal peaks in the band greater than the frequency are attenuated at the same time. In contrast, the measurement value provided by the laser interferometer displacement measuring system according to the present invention makes it possible to selectively eliminate optical noise of cycle λ, while allowing the magnitude of vibration signals caused by mechanical factors to remain unchanged. Use of the correction method according to the present invention causes an error of cycle λ in the signal indicative of the amount of light received that is detected by the light detector. Thus, the measurement of the frequency spectrum would provide an effect of correction as in the comparison of FIGS. 28A with 28B. The feature lies in that only those peaks corresponding to the frequency of cycle λ are selectively attenuated in the spectrum with respect to background components. This is observed in such a manner that the peaks are attenuated relative to the baseline (background components) of a spectrum near the peak of a frequency f. The intensity ratio of the peak to the baseline is to be referred to as a relative peak intensity. That is, in increasing accuracy in the present invention, the relative peak intensity of a peak of f=Nv/λ is selectively suppressed or attenuated. In contrast to this, in noise processing by averaging (time averaging), a variation in gain of frequency is gradual, and thus the peak and the baseline are attenuated by averaging generally with the same ratio at the same time, thereby maintaining the relative peak intensity to a constant magnitude. This can be clearly distinguished from the elimination of a signal of cycle λ according to the present invention. In addition, suppose the elimination of a signal of cycle λ according to the present invention is combined with the averaging. Even in this case, since the relative peak intensity of the peak provided by averaging to the baseline remains unchanged, a variation in the relative peak intensity occurs only in the elimination of a signal of cycle λ. This makes it possible to determine the availability of this approach in accordance with relative intensity. In addition, suppose the frequency spectrum of a measurement value is compared with a signal indicative of the amount of light received by the light detector. The peak of f=Nv/λ of the signal indicative of the amount of light received or a frequency component of N=n is a very signal provided by interference of light in accordance with the principle of laser interferometer displacement measurement and corresponds to the component of a uniform linear motion of the stage, being outputted as a linear increase in measurement value. Therefore, frequency components of N≠n correspond to measurement errors. In other words, the corrector means according to the present invention is characterized, when used, in that the peaks of N=1 to 2 n and N≠n are attenuated relative to the baseline.

However, since an error of cycle λ cannot be measured when the stage is at a standstill, the error of cycle λ is detected and corrected after the stage has been put into motion. This allows peaks to appear in the frequency spectrum of observed measurement values during the first movement or acceleration of the stage. When a correction value has been set or tracking has been performed to provide an appropriate value, these peaks are observed to have reduced.

The laser interferometer displacement measuring system according to the present invention is available for various types of systems and equipment describe in Embodiment 6, which are required for high accuracy machining, and is particularly useful for significantly increasing the measurement or machining accuracy of systems and equipment that employ a laser interferometer displacement measuring system with a multi-fold optical path.

Figure 24:
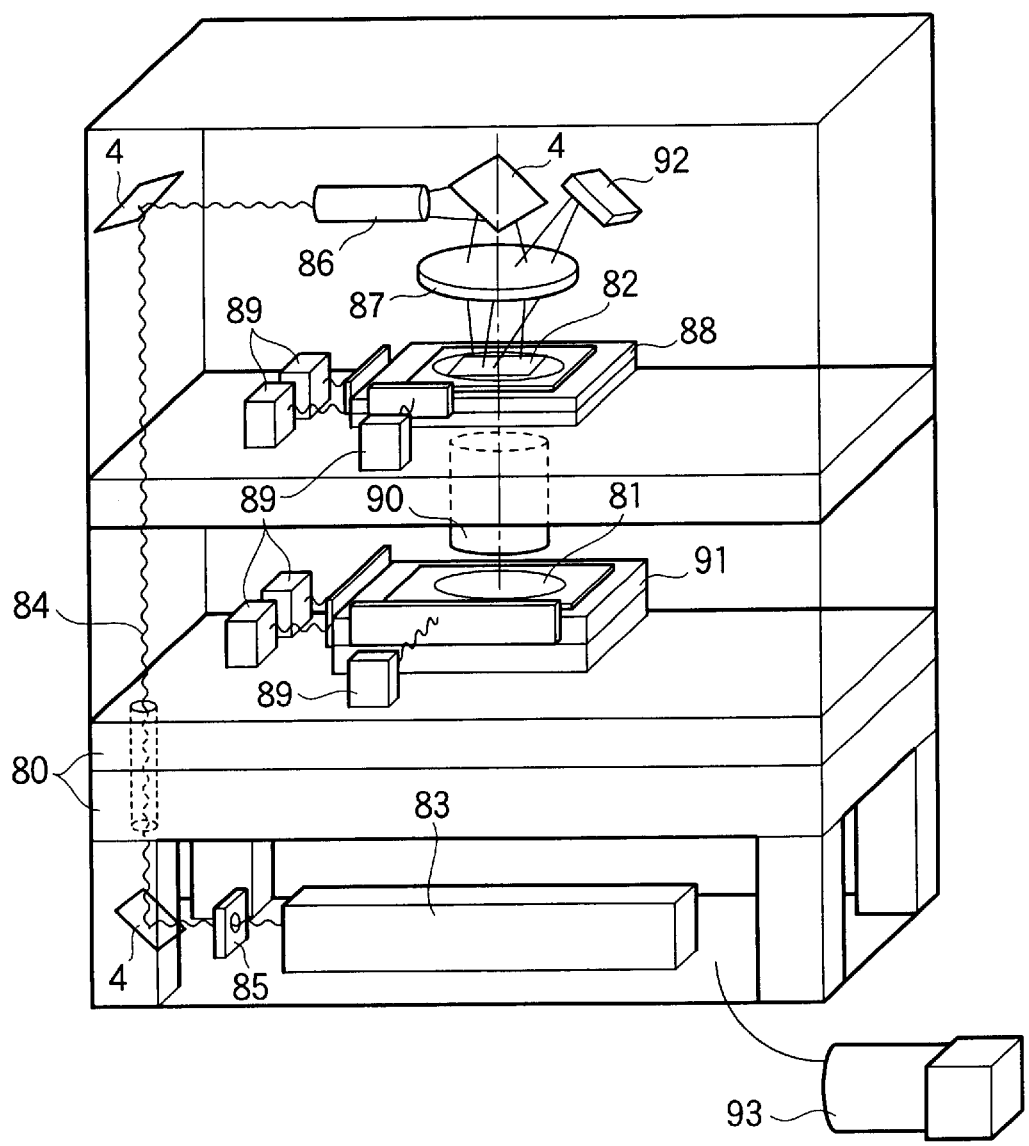
FIG. 24 is a view showing an exemplary configuration of an exposure system employing a laser interferometer displacement measuring system according to the present invention.

[Embodiment 8]
An Exemplary Configuration of Reducing Projection Exposure Apparatus FIG. 24 shows an exemplary configuration of reducing projection exposure apparatus (a stepper for semiconductors) that employs the laser interferometer displacement measuring system according to the present invention. A stage for placing a wafer 81 and a photomask 82 thereon is provided on an air spring vibration isolator 80 and protected from exterior vibration. Exposure light 84 emitted from an exposure light source 83 passes through a shutter 85 and is then reflected on the beam bender 4 to be introduced into the upper portion of the equipment. Subsequently, the exposure light 84 is expanded in diameter of the beam by means of a beam expander means 86 and passes through a lens 87 to illuminate the photomask 82. The photomask 82 is mounted on a photomask stage 88 and adapted to be movable. The photomask stage 88 comprises the reflector 8. The position of the photomask stage 88 is measured by three laser displacement measurement units 89 each comprising the laser interferometer displacement measuring system, described in Embodiments 1 to 7, which can detect the displacement and rotational error of the stage. Incidentally, an interferometer and a light detector, which are housed inside the laser displacement measurement unit 89, can measure the distance to a reflector. The exposure light that has passed through the photomask 82 is condensed to a given scale by means of a reducing projection lens 90 and thereafter illuminated onto the wafer 81. This causes the pattern on the photomask 82 is projected onto the wafer 81. The exposure time is controlled by opening or closing the shutter 85. A wafer stage 91 for placing the wafer 81 thereon comprises the reflector 8. The positional and rotational errors of the wafer stage 91 are measured by means of the three laser displacement measurement units 89. It is preferable that the photomask stage 88 and the wafer stage 91 can be moved by means of a motor and comprises an inching mechanism for inching such as a piezoelectric device. The accurate positional relationship between the wafer and photomask is detected with an alignment detection unit (alignment detection means) 92. The alignment detection means 92 comprises light-emitting and light-receiving devices and detects alignment patterns prepared on the wafer and the photomask, thereby making it possible to accurately measure a positional shift in pattern in the range of accuracy of about 2 nm or less. With employing the first alignment signal as reference, the stage is repeatedly moved. The use of the laser interferometer displacement measuring system that provides a high measurement accuracy will implement an accurate alignment, thereby increasing the superposition accuracy of the pattern to be exposed onto the wafer. Incidentally, a configuration adapted to employ an evacuator means 93 for reducing the pressure of the entire equipment will make it possible to use ultraviolet light of a short wavelength as an exposure light in a vacuum, thereby implementing fine patterning. It is also possible to prevent the effect of a variation in refractivity of air in the measurement optical path, thereby making it possible to further improve the superposition accuracy of a pattern.

In addition, an integrally configured exposure apparatus would make it possible to control the equipment integrally including the movement of the stage. Thus, the stage can be moved in advance at the time of initializing the equipment to detect the error that occurs in the cycle of the wavelength of the measurement laser light and set a correction value. In this case, it is not always necessary to update the correction value in real time by automatic tracking or automatic feedback. This provides an advantage of much more simplifying the configuration of the means for generating and updating the correction value.

Among other things, the use of the laser interferometer displacement measuring system according to the present invention will provides a considerable advantage in manufacturing a fine circuit pattern, having a 0.07 $\mu$m rule width or less, which requires a measurement accuracy in the range of below 2 nm. The wavelength of the exposure light required for the exposure of this rule width is predicted to be 160 nm or less. The laser interferometer displacement measuring system is particularly useful for an exposure apparatus that employs such a short wavelength.

Figure 25:
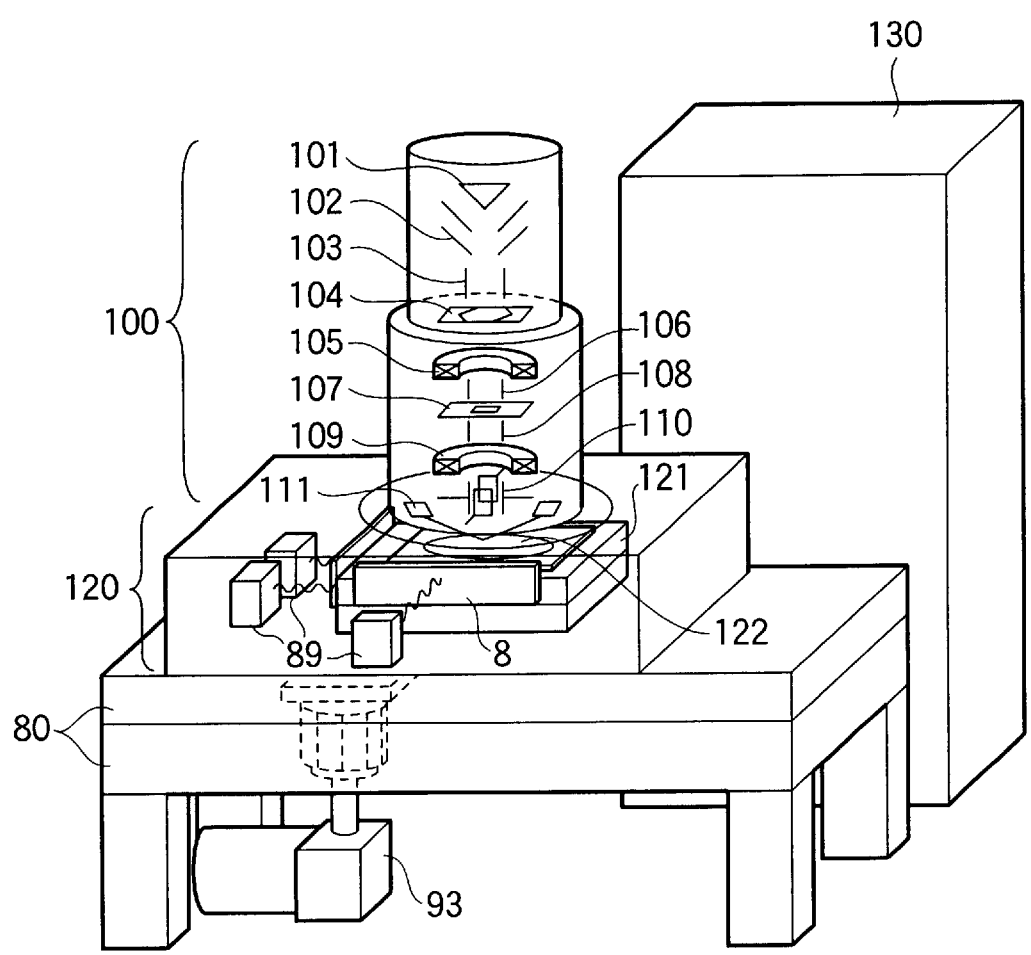
FIG. 25 is a view showing an exemplary configuration of an electron beam lithography apparatus employing a laser interferometer displacement measuring system according to the present invention.

[Embodiment 9]
Exemplary Configuration of an Electron-beam Mask Drawing Apparatus FIG. 25 shows an exemplary configuration of equipment, incorporating the laser interferometer displacement measuring system according to the present invention, for drawing a lithography mask (reticle) with an electron beam. The equipment comprises the air spring vibration isolator 80 and is divided largely into three portions of an electron-beam gun unit 100, a stage unit 120, and a control unit 130. A high voltage is applied between an electron-beam gun 101 and an acceleration voltage electrode 102, thereby generating an electron beam. A beam-shaping deflector 103 directs this electron beam to an arbitrary point on a first beam-shaping mask 104 to shape a beam for the first time. The electron beam that has passed through the first beam-shaping mask 104 passes through a condenser lens 105 and a blanking voltage electrode 106, thereafter being shaped again by a second beam-shaping mask 107. After having passed through the second beam-shaping mask 107, the electron beam is deflected by a positioning deflector 108 and then condensed towards a drawing point through an objective lens 109. After having passed through a secondary deflection electrode 110, the electron beam is illuminated onto a master photomask 122 placed on an X-Y stage 121. The illuminated point on the master photomask 122 is selected by the aforementioned positioning deflector 108 and the aforementioned secondary deflection electrode 110, and the voltage to be applied to the aforementioned blanking voltage electrode 106 is controlled to turn on or off the illumination of the electron beam, thereby drawing a desired pattern on the master photomask. The control unit 130 controls these signals. The X-Y stage 121 can be moved to select the region on the master photomask where the pattern is drawn. The position of the X-Y stage 121 is measured accurately with the laser displacement measurement unit 89. The laser displacement measurement unit houses the interferometer and the light detector (photo-detector) for measuring the displacement of the reflector 8 on the X-Y stage 121. A motor is used to drive the X-Y stage. The aforementioned laser displacement measurement unit measures a control error with respect to the target position of the X-Y stage and the voltage applied to the secondary deflection electrode 110 is controlled for deflection correction. A wafer height sensor 111 is used for detecting a variation in height of the master photomask, adjusting the aforementioned objective lens, and controlling automatically the focusing of an electron beam illuminated onto the wafer, thereby making it possible to draw a fine pattern with high resolution. A detection signal, measured by the laser displacement measurement unit 89, of the light detector is processed using the signal processing method of the laser interferometer displacement measuring system described in Embodiments 1 to 7, thereby making it possible to provide a high accuracy measurement value for accurate position detection. This makes it possible to draw a pattern on the master photomask with an increased accuracy.

The laser interferometer displacement measuring system according to the present invention has an outstanding effect, among other things, on the continuous movement drawing in which an electron beam is illuminated down to the wafer to draw a pattern with the X-Y stage being continuously moved. When found is a difference between the target position of the stage and the current position measured by the laser interferometer displacement measuring system, the aforementioned electron beam lithography apparatus deflects the electron beam to correct the difference. Without the approach to increasing the accuracy of measurement values in the laser interferometer displacement measuring system according to the present invention, an error signal having a cycle of wavelength $\lambda$ of laser light is added to deflection correction. This measurement error directly turns to be an error in drawing a pattern. In contrast to this, with the approach to increasing the accuracy of measurement values in the laser interferometer displacement measuring system according to the present invention, the measurement error of cycle $\lambda$ is corrected and thereby a proper pattern is drawn. In addition, unlike the noise processing by averaging, since it is possible to selectively eliminate only an optical error of the laser interferometer displacement measuring system, other signals (caused such as by mechanical vibrations) can be detected without impairing the frequency band. This makes it possible to minimize a control error caused by a delay in response time. This allows for implementing a high drawing accuracy.

In addition, an integrally configured electron beam lithography apparatus would make it possible to control the equipment integrally including the movement of the stage. Thus, the stage can be moved in advance at the time of initializing the equipment to detect the error that occurs in the cycle of the wavelength of the measurement laser light and set a correction value. In this case, it is not always necessary to update the correction value in real time by automatic tracking or automatic feedback. This provides an advantage of much more simplifying the configuration of the means for generating and updating the correction value.

As described above, the present invention makes it possible to correct a measurement error corresponding to the wavelength cycle of laser light. Thus, the present invention can provide increased accuracy in the range of below 1 nm upon measurement of a displacement of a sample or a target work when employed for a high accuracy displacement measurement, instrumentation, and evaluation technique, which requires high absolute accuracy of the order of nanometer, or for precision and fine patterning techniques such as semiconductor and master mask patterning.

What is claimed is:

1. A laser interferometer displacement measuring system comprising
   a displacement measurement mechanism making use of laser interference to produce a measurement value; and
   corrector means for adding a correction value to or subtracting the correction value from said measurement value produced by said displacement measurement mechanism,
   wherein said correction value used by said corrector means is a cyclic correction value generated based on said measurement value and having a cycle corresponding to a wave cycle of laser light.

2. A laser interferometer displacement measuring system comprising:
   a displacement measuring mechanism making use of laser interference to produce a measurement value; and
   corrector means for adding a correction value to or subtracting the correction value from said measurement value produced by said displacement measurement mechanism,
   wherein said corrector means has storage means for storing as said correction value a cyclic correction value generated based on said measurement value and having a cycle corresponding to a wave cycle of laser light, and
   wherein said correction value is read out of said storage means in accordance with said measurement value and is added to or subtracted from said measurement value.

3. A laser interferometer displacement measuring system, comprising:
   a laser light source;
   an interferometer for dividing laser light of wavelength $\lambda$ emitted from said laser light source into a reference path beam and a measurement path beam to interfere said reference path beam with said measurement path beam having been reflected from a subject body;
   a light detector for detecting the light subjected to the interference in said interferometer to produce a measurement value;
   measurement value output means for converting a detection signal of said light detector into said measurement value and outputting said measurement value,
   wherein a displacement of the subject body causes an n-fold variation in length of an optical path between said interferometer and the subject body; and
   corrector means for adding a correction value to or subtracting the correction value from said measurement value output by said measurement value output means,
   wherein said measurement value is a variable, and said correction value generated based on said measurement value and used by said corrector means is a cyclic function having a cycle of $\lambda/n$ or a sum of a plurality of cyclic functions having said cycle of $\lambda/n$ as a fundamental cycle.

4. The laser interferometer displacement measuring system according to claim 3, wherein the plurality of cyclic functions having said cycle of $\lambda/n$ as a fundamental cycle are the cyclic function having a cycle of $\lambda/n$ and harmonic cyclic functions thereof.

5. The laser interferometer displacement measuring system according to any one of claims 1 to 4, further comprising
   means for performing feedback control so as to carry out tracking adjustment of a phase and amplitude of the correction value.

6. The laser interferometer displacement measuring system according to any one of claims 1 to 5, wherein averaging unit means capable of averaging over time is provided after said corrector means.

7. A laser interferometer displacement measuring system comprising:
   a displacement measurement mechanism making use of laser interference to produce a measurement value;
   error signal component generating means for eliminating a constant speed component and an acceleration component from said measurement value produced by said displacement measurement mechanism and generating an error signal component based on said measurement value;
   storage means for storing said error signal component from said error signal component generating means corresponding to said measurement value; and
   means for allowing said error signal component stored in said storage means to be added to or subtracted from said measurement value of said displacement measurement mechanism as a correction value.

8. A laser interferometer displacement measuring system, comprising:

a laser light source;

an interferometer for dividing laser light of wavelength $\lambda$ emitted from said laser light source into a reference path beam and a measurement path beam to interfere said reference path beam with said measurement path beam having been reflected from a subject body;

a light detector for detecting the light subjected to the interference in said interferometer to produce a measurement value;

measurement value output means for converting a detection signal of said light detector into said measurement value and outputting said measurement value, wherein a displacement of the subject body causes an n-fold variation in length of an optical path between said interferometer and the subject body; and corrector means for adding a correction value generated based on said measurement value to or subtracting said correction value from said measurement value output by said measurement value output means, wherein said corrector means comprises:

means for storing or calculating, with said measurement value being employed as a variable, said correction value as a cyclic function having a cycle of $\lambda/n$ or said cyclic function having a cycle of $\lambda/n$ and harmonic cyclic functions thereof, error signal component generating means for eliminating a constant speed component and an acceleration component from said measurement value of said displacement measurement mechanism and generating an error signal component, adjustment means for adjusting an amplitude and a phase of said cyclic function so that said cyclic function having a cycle of $\lambda/n$ or a sum function of said cyclic function having a cycle of $\lambda/n$ and harmonic cyclic functions thereof fits to said error signal component, and means for allowing a function value of said cyclic function having a cycle of $\lambda/n$ or a function value of said sum function of said cyclic function having a cycle of $\lambda/n$ and harmonic cyclic functions thereof to be added to or subtracted from said measurement value.

9. An apparatus comprising a stage for placing thereon and moving a sample or a subject work, drive means for driving said stage, and a laser interferometer displacement measuring system for measuring a position of said stage, wherein as said laser interferometer displacement measuring system, the laser interferometer displacement measuring system according to any one of claims 1–5, 8 and 8 is employed.

10. An apparatus comprising a stage for placing thereon and moving a sample or a subject work, drive means for driving said stage, and a laser interferometer displacement measuring system for measuring a position of said stage, wherein as said laser interferometer displacement measuring system, the laser interferometer displacement measuring system according to claim 7 is employed.

* * * * *